(12) United States Patent
Otagiri et al.

(10) Patent No.: US 9,893,652 B2
(45) Date of Patent: Feb. 13, 2018

(54) ELECTRICITY-GENERATING ELEMENT UNIT, ELECTRIC GENERATOR, FOOTWEAR, AND FLOORING MATERIAL

(71) Applicants: Mizuki Otagiri, Kanagawa (JP); Tsuneaki Kondoh, Kanagawa (JP); Tomoaki Sugawara, Kanagawa (JP); Yuko Arizumi, Kanagawa (JP); Junichiro Natori, Kanagawa (JP); Takahiro Imai, Tokyo (JP)

(72) Inventors: Mizuki Otagiri, Kanagawa (JP); Tsuneaki Kondoh, Kanagawa (JP); Tomoaki Sugawara, Kanagawa (JP); Yuko Arizumi, Kanagawa (JP); Junichiro Natori, Kanagawa (JP); Takahiro Imai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 17 days.

(21) Appl. No.: 15/152,085

(22) Filed: May 11, 2016

(65) Prior Publication Data
US 2016/0344309 A1 Nov. 24, 2016

(30) Foreign Application Priority Data

May 18, 2015 (JP) ................................. 2015-101279

(51) Int. Cl.
*F02B 63/04* (2006.01)
*F03G 7/08* (2006.01)
(Continued)

(52) U.S. Cl.
CPC ............. *H02N 2/18* (2013.01); *A43B 3/0015* (2013.01); *F03G 5/06* (2013.01); *H01L 41/0477* (2013.01); *H01L 41/183* (2013.01)

(58) Field of Classification Search
USPC ............................................ 290/1 R; 36/141
See application file for complete search history.

(56) References Cited

U.S. PATENT DOCUMENTS 3,718,563 A * 2/1973 Krull .................... G01N 27/404
204/415
4,291,707 A * 9/1981 Heilman .............. A61N 1/0587
607/129
(Continued)

FOREIGN PATENT DOCUMENTS

| JP | 06-209807 | 8/1994 |
| JP | 2010-246361 | 10/2010 |
| JP | 2012-249367 | 12/2012 |

*Primary Examiner* — Pedro J Cuevas
(74) *Attorney, Agent, or Firm* — Oblon, McClelland, Maier & Neustadt, L.L.P.

(57) ABSTRACT

An electricity-generating element unit including a plurality of electricity-generating elements, each of the plurality of electricity-generating elements including a first electrode, an intermediate layer, and a second electrode disposed with the intermediate layer being between the first electrode and the second electrode, and a coupling unit coupling the plurality of electricity-generating elements to each other, wherein when an external force is applied to at least one of the plurality of electricity-generating elements to bring the first electrode and the second electrode of the at least one of the plurality of electricity-generating elements close to each other, a distance between the first electrode and the second electrode of the electricity-generating element or each of the electricity-generating elements to which an external force is not applied is increased by the coupling unit.

17 Claims, 7 Drawing Sheets

(51) Int. Cl.
- *H02K 7/18* (2006.01)
- *H02N 2/18* (2006.01)
- *H01L 41/18* (2006.01)
- *H01L 41/047* (2006.01)
- *F03G 5/06* (2006.01)
- *A43B 3/00* (2006.01)
- *A61F 5/14* (2006.01)

(56) References Cited

U.S. PATENT DOCUMENTS

| | | | | |
|---|---|---|---|---|
| 5,269,810 A * | 12/1993 | Hull | ............ | A61N 1/04 600/395 |
| 5,313,451 A * | 5/1994 | Yagi | ............ | G01D 9/00 250/310 |
| 5,496,362 A * | 3/1996 | KenKnight | ............ | A61N 1/0587 607/129 |
| 5,827,160 A * | 10/1998 | Ohki | ............ | B29C 59/16 492/56 |
| 5,846,063 A * | 12/1998 | Lakic | ............ | A42B 3/122 2/413 |
| 5,916,243 A * | 6/1999 | KenKnight | ............ | A61N 1/0587 607/129 |
| 6,014,823 A * | 1/2000 | Lakic | ............ | A41D 19/01523 36/11.5 |
| 6,026,332 A * | 2/2000 | Kenknight | ............ | A61N 1/0587 607/129 |
| 6,032,079 A * | 2/2000 | KenKnight | ............ | A61N 1/0587 607/129 |
| 6,038,483 A * | 3/2000 | KenKnight | ............ | A61N 1/0587 607/129 |
| 6,152,955 A * | 11/2000 | KenKnight | ............ | A61N 1/0587 607/129 |
| 6,557,413 B2 * | 5/2003 | Nieminen | ............ | B81B 3/0072 310/311 |
| 6,657,525 B1 * | 12/2003 | Dickens | ............ | H01G 5/16 200/181 |
| 7,069,672 B2 * | 7/2006 | Hahn | ............ | A43B 1/0045 36/141 |
| 7,231,730 B1 * | 6/2007 | Ryan | ............ | A61H 7/001 36/141 |
| 7,347,831 B2 * | 3/2008 | Chiu | ............ | A43B 3/0005 36/141 |
| 7,487,606 B2 * | 2/2009 | Koo | ............ | A43B 1/0054 36/141 |
| 7,614,168 B1 * | 11/2009 | Zummer | ............ | A61H 15/0078 36/141 |
| 7,640,681 B2 * | 1/2010 | Yang | ............ | A61F 5/14 36/141 |
| 7,709,285 B2 * | 5/2010 | Van Beek | ............ | B81B 3/0078 257/E31.001 |
| 7,918,062 B2 * | 4/2011 | Chen | ............ | B41J 3/407 427/284 |
| 7,969,262 B2 * | 6/2011 | Steeneken | ............ | B81B 3/0059 200/181 |
| 8,203,402 B2 * | 6/2012 | Steeneken | ............ | H01H 59/0009 335/78 |
| 8,365,488 B2 * | 2/2013 | Chen | ............ | B41J 3/407 427/284 |
| 8,558,434 B2 * | 10/2013 | Suda | ............ | F03G 7/005 310/363 |
| 8,632,481 B2 * | 1/2014 | Shi | ............ | A43B 3/0015 601/78 |
| 8,828,491 B2 * | 9/2014 | McAlister | ............ | B01D 39/20 427/248.1 |
| 8,879,685 B2 * | 11/2014 | Oshio | ............ | A43B 3/0005 36/114 |
| 8,919,989 B2 * | 12/2014 | Tseng | ............ | H01L 41/04 362/103 |
| 9,315,994 B2 * | 4/2016 | Chen | ............ | B41J 2/005 |
| 9,409,382 B2 * | 8/2016 | Hakansson | ............ | B32B 38/145 |
| 9,502,638 B2 * | 11/2016 | McAlpine | ............ | H01L 41/314 |
| 9,538,809 B2 * | 1/2017 | Park | ............ | A43B 7/144 |
| 9,691,240 B2 * | 6/2017 | Bradford | ............ | E04F 15/02 |
| 2002/0179421 A1 * | 12/2002 | Williams | ............ | H01H 59/0009 200/181 |
| 2003/0227361 A1 * | 12/2003 | Dickens | ............ | H01G 5/16 335/78 |
| 2004/0111924 A1 * | 6/2004 | Riccardi | ............ | A43B 7/1465 36/141 |
| 2006/0185196 A1 * | 8/2006 | Wang | ............ | A43B 7/146 36/141 |
| 2006/0235465 A1 * | 10/2006 | Koo | ............ | A43B 1/0054 606/204 |
| 2007/0222007 A1 * | 9/2007 | Van Beek | ............ | B81B 3/0078 257/415 |
| 2007/0283648 A1 * | 12/2007 | Chen | ............ | B41J 3/407 52/313 |
| 2008/0005936 A1 * | 1/2008 | Chiu | ............ | A43B 3/0005 36/3 B |
| 2008/0015477 A1 * | 1/2008 | Talish | ............ | A61H 1/005 601/79 |
| 2008/0066343 A1 * | 3/2008 | Sanabria-Hernandez | ............ | A43B 3/0005 36/43 |
| 2008/0132811 A1 * | 6/2008 | Yang | ............ | A61F 5/14 601/30 |
| 2009/0211885 A1 * | 8/2009 | Steeneken | ............ | H01H 59/0009 200/181 |
| 2010/0001615 A1 * | 1/2010 | Steeneken | ............ | B81B 3/0059 310/300 |
| 2010/0186263 A1 * | 7/2010 | Lee | ............ | A43B 7/081 36/3 B |
| 2011/0109203 A1 * | 5/2011 | McAlpine | ............ | H01L 41/314 310/345 |
| 2011/0219716 A1 * | 9/2011 | Chen | ............ | B41J 3/407 52/316 |
| 2012/0161586 A1 * | 6/2012 | Suda | ............ | F03G 7/005 310/363 |
| 2012/0312456 A1 * | 12/2012 | McAlpine | ............ | H01L 41/314 156/151 |
| 2013/0028368 A1 * | 1/2013 | Oshio | ............ | A43B 3/0005 377/24.2 |
| 2013/0055593 A1 * | 3/2013 | Park | ............ | A43B 13/182 36/102 |
| 2013/0064979 A1 * | 3/2013 | McAlister | ............ | B01D 39/20 427/372.2 |
| 2013/0101808 A1 * | 4/2013 | McAlister | ............ | B01D 39/20 428/194 |
| 2013/0122255 A1 * | 5/2013 | Chen | ............ | B41J 3/407 428/157 |
| 2014/0126186 A1 * | 5/2014 | Tseng | ............ | H01L 41/04 362/103 |
| 2014/0144583 A1 * | 5/2014 | Hakansson | ............ | B32B 38/145 156/277 |
| 2014/0180376 A1 * | 6/2014 | Jennings | ............ | A61N 1/0456 607/144 |
| 2015/0044378 A1 * | 2/2015 | McAlister | ............ | B01D 39/20 427/372.2 |
| 2015/0248083 A1 | 9/2015 | Kondoh et al. | | |
| 2015/0252821 A1 | 9/2015 | Sugawara et al. | | |
| 2015/0272263 A1 * | 10/2015 | Szent-Miklosy | ............ | A43B 3/0015 36/25 R |
| 2016/0144402 A1 * | 5/2016 | Kandori | ............ | B06B 1/0292 73/632 |
| 2016/0217664 A1 * | 7/2016 | Bradford | ............ | E04F 15/02 |
| 2016/0331077 A1 * | 11/2016 | Park | ............ | A43B 13/182 |

* cited by examiner

ELECTRICITY-GENERATING ELEMENT UNIT, ELECTRIC GENERATOR, FOOTWEAR, AND FLOORING MATERIAL

CROSS-REFERENCE TO RELATED APPLICATIONS

The present application claims priority under 35 U.S.C. § 119 to Japanese Patent Application No. 2015-101279, filed May 18, 2015. The contents of which are incorporated herein by reference in their entirety.

BACKGROUND OF THE INVENTION

Field of the Invention

The present disclosure relates to electricity-generating element units, electric generators, footwear, and flooring materials.

Description of the Related Art

Hitherto, there have been attempts for effectively utilizing energy generated by vibrations of structures such as roads, bridges, and architectures, and vibrations of moving bodies such as cars, and train carriages. Examples of a method for effectively utilizing the energy generated by vibrations include a method where vibration energy is converted into electric energy. Examples of the method for converting vibration energy into electric energy include a method using a piezoelectric element, and a method utilizing electrostatic induction.

For example, a proposed method for drawing the vibration energy as electric energy is that a piezoelectric element is arranged in a bottom of a shoe or in an insole to obtain electric energy through motions of walking (for example, see Japanese Unexamined Patent Application Publication No. 06-209807). However, a mere arrangement of a piezoelectric element in the bottom of a shoe or insole, as proposed, cannot generate high electric power.

SUMMARY OF THE INVENTION

An electricity-generating element unit of the present invention includes a plurality of electricity-generating elements and a coupling unit the plurality of electricity-generating elements to each other. Each of the plurality of electricity-generating elements includes a first electrode, an intermediate layer, and a second electrode disposed with the intermediate layer being between the first electrode and the second electrode. When an external force is applied to at least one of the plurality of electricity-generating elements to bring the first electrode and the second electrode of the at least one of the plurality of electricity-generating elements close to each other, a distance between the first electrode and the second electrode of the electricity-generating element or each of the electricity-generating elements to which an external force is not applied is increased by the coupling unit.

Figure 1:
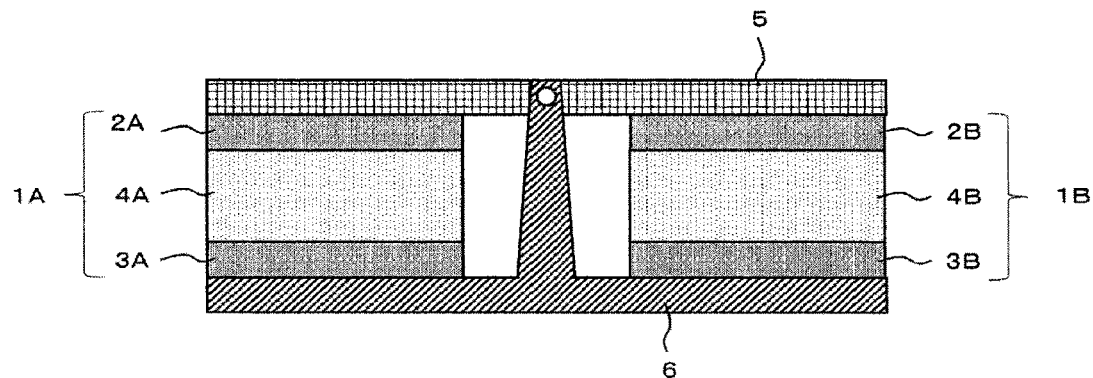
FIG. 1 is a schematic cross-sectional view illustrating one example of an electricity-generating element unit of the present invention.

DESCRIPTION OF THE EMBODIMENTS (Electricity-Generating Element Unit)

An electricity-generating element unit of the present invention includes a plurality of electricity-generating elements, and a coupling unit coupling the plurality of electricity-generating elements to each other. The electricity-generating element unit may further include other members, if necessary.

Because the plurality of electricity-generating elements are coupled to each other by the coupling unit, power generation of the electricity-generating elements can be efficiently performed.

The present invention has an object to provide an electricity-generating element unit that can generate high electric power. The present invention can provide an electricity-generating element unit that can generate high electric power.

<Electricity-Generating Element>

An electricity-generating element includes a first electrode, an intermediate layer, and a second element disposed with the intermediate layer being between the first electrode and the second electrode. The electricity-generating element may further include other members, if necessary.

<<First Electrode and Second Electrode>>

A material of the first electrode and a material of the second electrode, and shapes, sizes, and structures of the first and second electrodes may be appropriately selected depending on the intended purpose without any limitation.

The material, the shape, the size, and the structure of the first electrode may be identical to or different from the material, the shape, the size, and the structure of the second electrode, but they are preferably identical to each other.

Examples of materials of the first electrode and the second electrode include metals, carbon-based conductive materials, and conductive rubber compositions.

Examples of the metals include gold, silver, copper, iron, aluminium, stainless steel, tantalum, nickel, and phosphor bronze.

Examples of the carbon-based conductive materials include graphite, carbon fibers, and carbon nanotubes.

Examples of the conductive rubber compositions include compositions containing conductive filler and rubber.

Examples of the conductive filler include carbon materials (e.g., Ketjenblack, acetylene black, graphite, carbon fibers (CF), carbon nanofibers (CNF), and carbon nanotubes (CNT)), metal filler (e.g., gold, silver, platinum, copper, iron, aluminium, and nickel), conductive polymer materials (e.g., derivatives of any of polythiophene, polyacetylene, polyaniline, polypyrrole, poly(p-phenylene), and poly(p-phenylene)vinylene, or the derivatives doped with a dopant such as anions and cations), and ionic liquids. The above-listed examples of the conductive filler may be used alone or in combination.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex). The above-listed examples of the rubber may be used alone or in combination.

Examples of the form of the first electrode and the form of the second electrode include a sheet, a film, a thin film, fabric, nonwoven fabric, a mesh, and a sponge. Note that, the form of the first electrode or the form of the second electrode may be nonwoven fabric formed by overlapping fibers of the carbon material.

Examples of the film include conductive films.

Examples of the conductive films include composite films, in each of which a metal foil is bonded to a polymer film. A commercially available product may be used as the conductive film. Examples of the commercially available product include ALPET 9-100 and ALPET 25-25 (both available from PANAC Corporation).

The shape of the first electrode and the shape of the second electrode are not particularly limited and may be appropriately selected depending on a shape of the electricity-generating element.

The size of the first electrode and the size of the second electrode are not particularly limited and may be appropriately selected depending on a shape of the electricity-generating element.

An average thickness of the first electrode and an average thickness of the second electrode and may be appropriately selected depending on a structure of the electricity-generating element. The average thickness of the first electrode and the average thickness of the second electrode are preferably in a range of from 0.01 µm through 1 mm, and more preferably from 0.1 µm through 500 µm, in view of conductivity and flexibility. When the average thickness of each of the first electrode and the second electrode is 0.01 µm or greater, an adequate mechanical strength of the electrode is obtained, and conduction is improved. When the average thickness of each of the first electrode and the second electrode is 1 mm or less, moreover, a resultant electricity-generating element is deformable, and an excellent power-generating performance is obtained.

<<Intermediate Layer>>

The intermediate layer is located between the first electrode and the second electrode. Electricity is generated by applying a force to the intermediate layer. The intermediate layer may be bonded to the first electrode and the second electrode, or may not be bonded to the first electrode and the second electrode.

A material, a shape, a size, and a structure of the intermediate layer may be appropriately selected depending on the intended purpose without any limitation.

The material of the intermediate layer may be appropriately selected depending on the intended purpose without any limitation, as long as the material has a property that can convert a force into electricity. Examples of the material of the intermediate layer include ceramics, electret dielectric, and rubber. Among the above-listed materials, rubber is preferable because the rubber has flexibility.

<<<Ceramics>>>

The intermediate layer formed of ceramic generates electricity in the following manner. Specifically, when a force is applied to the intermediate layer to shift ions in crystals. As a result of the shift of the ions, the crystals cause "dielectric polarization" where one end of the crystal is positively charged and the other end of the crystal is negatively charged, to thereby generate electricity.

Examples of the ceramics include calcium titanate ($CaTiO_3$), barium titanate ($BaTiO_3$), lead titanate ($PbTiO_3$), lead zirconate titanate (PZT), zinc oxide (ZnO), potassium niobate ($KNbO_3$), lithium niobate ($LiNbO_3$), lithium tantalate ($LiTaO_3$), sodium tungstate ($Na_xWO_3$), zinc oxide (ZnO, $Zn_2O_3$), sodium potassium niobate ((K, Na)$NbO_3$), bismuth ferrite ($BiFeO_3$), sodium niobate ($NaNbO_3$), bismuth titanate ($Bi_4Ti_3O_{12}$), and bismuth sodium titanate ($Na_{0.5}Bi_{0.5}TiO_3$). Among the above-listed materials, lead zirconate titanate (PZT) is preferable because PZT has excellent piezoelectricity.

—Production Method of Intermediate Layer Formed of Ceramics—

For example, the intermediate layer formed of ceramic can be formed by forming a ceramic film on the electrode, followed by a polarization treatment.

——Formation of Ceramic Film——

A formation method of the ceramic film includes a treatment for placing ceramic powder onto an electrode, and a heating treatment. The treatment for placing ceramic powder may be appropriately selected depending on the intended purpose without any limitation, as long as the treatment enables the ceramic powder to be placed onto a predetermined position, such as a base. Examples of the treatment include gas-jet deposition.

The gas-jet deposition is a method where ceramic powder is crushed onto the electrode at high speed using inert gas as a carrier to thereby form a ceramic film. The heating treatment is preferably performed at a temperature of 600° C. or higher considering an improvement of piezoelectric properties. A duration of the heating treatment may be appropriately selected.

An average thickness of the ceramic film is preferably in a range of from 0.5 µm through 150 µm, and more preferably from 10 µm through 100 µm. A device for performing a high-temperature treatment of the ceramic and a device for dispersing the ceramic may be appropriately selected depending on the intended purpose.

——Polarization Treatment——

The polarization treatment is a treatment where the ceramic film is heated, and an electric field is externally applied to the ceramic film, followed by slowly cooling the ceramic film. As a result of the polarization treatment, the ceramic film has spontaneous polarization, and has piezoelectricity. At the stage of the ceramic film where the ceramic powder is placed on an electrode and baked, spontaneous polarization of particles of the ceramic powder is in various directions, and therefore the polarizations are canceled out and the ceramic film as a whole is not polarized. The ceramic film therefore does not have piezoelectricity. The directions of the spontaneous polarization are aligned in one direction by performing the polarization treatment, and the ceramic film as a whole has spontaneous polarization.

A heating temperature in the polarization treatment may be appropriately selected depending on a material of ceramic particles without any limitation. In the case of lead zirconate titanate (PZT), for example, the heating temperature is preferably in a range of from 200° C. through 300° C. Moreover, the magnetic field externally applied in the polarization treatment may be appropriately selected depending on a material of ceramic particles without any limitation. In the case of lead zirconate titanate (PZT), for example, the electric field is preferably in a range of from 30 kV/cm through 70 kV/cm.

<<<Electret Dielectric>>>

The intermediate layer formed of the electret dielectric generates electricity in the following manner. A force is applied to change relative positions of the electret dielectric and electrodes disposed with a distance from the electret dielectric. As a result, charges are electrostatically induced in the electrode to generate electricity.

The electret dielectric can be obtained by charging an electret material.

Examples of the electret material include polypropylene, polyethylene terephthalate, and amorphous fluororesins Among the above-listed materials, polyvinylidene fluoride and amorphous fluororesins are preferable in view of power-generating performance. A commercially available product can be used as the electret dielectric. Examples of the commercially available product include CYTOP series (available from ASAHI GLASS CO., LTD.).

An average thickness of the electret dielectric is preferably in a range of from 1 μm through 100 μm.

—Production Method of Intermediate Layer Formed of Electret Dielectric—

The intermediate layer formed of the electret dielectric can be produced by forming an electret material film on an electrode, followed by charging the electret material.

——Formation of Electret Material Film——

A formation method of the electret material film may be appropriately selected depending on the intended purpose. Examples of the formation method include spin coating.

——Charging of Electret Material——

Examples of a method for charging the electret material include a corona discharge treatment. As a result of the corona discharge treatment, charges are trapped in the electret material to semi-permanently generate an electrostatic field to thereby initiate charging.

An applied voltage in the corona discharge treatment may be appropriately selected depending on the electret material. In the case of a fluororesin, for example, the applied voltage is preferably in a range of from ±6 kV through ±30 kV. When the applied voltage is within the aforementioned preferable range, an ability to generate electricity can be imparted to the electret material, and durability of the intermediate layer can be ensured because an excessive amount of the energy is not applied.

<<<Rubber>>>

A mechanism of power generation of the intermediate layer formed of the rubber has not yet been clarified, but it is assumed as follows. First, the intermediate layer adjacent to the electrodes moves relative to surfaces of the first electrode and the second electrode, when a load, such as an external force and vibrations, is applied to charge the intermediate layer in a mechanism similar to friction charging, or to generate charge inside the intermediate layer formed of the rubber. As a result, a difference in surface potential is formed. The charge is moved to make the surface potential difference zero to thereby generate electricity.

Examples of the rubber include silicone rubber, fluorosilicone rubber, acrylic rubber, chloroprene rubber, natural rubber (latex), urethane rubber, fluororubber, and ethylene propylene rubber. Among the above-listed examples, silicone rubber is preferable.

The intermediate layer formed of the rubber may has a multi-layer structure.

The intermediate layer formed of the rubber can move microscopically in a parallel direction relative to the first electrode surface and the second electrode surface, when the intermediate layer is in contact with at least one of the first electrode and the second electrode, and is pressed in a vertical direction in a state where the intermediate layer and the first electrode or the second electrode are not secured with each other.

Note that, the state expressed by the phrase "not secured with each other" means a state where at least one of the first electrode, the second electrode, and the intermediate layer formed of the rubber is movable. Even when the first electrode and the second electrode are secured with the intermediate layer formed of the rubber at peripheral areas, each of the first electrode, the second electrode, and the intermediate layer formed of the rubber has flexibility, and the intermediate layer formed of the rubber is therefore at least partially movable in a parallel direction relative to the first electrode surface and the second electrode surface.

In order to impart various functions to the intermediate layer, filler may be added to the intermediate layer formed of the rubber. Examples of the filler include titanium oxide, barium titanate, lead zirconate titanate, zinc oxide, silica, calcium carbonate, carbon black, carbon nanotubes, carbon fibers, iron oxide, PTFE, mica, clay minerals, synthetic hydrotalcite, and metals. In the case where piezoelectric filler or polarized polymer (a base material or polymer) is used, a polarization treatment is preferably performed.

A hardness (JIS-A hardness) of the intermediate layer formed of the rubber is preferably less than 60°, more preferably 52° or less, and even more preferably 42° or less. When the hardness of the intermediate layer is less than 60°, the movement of the rubber is not inhibited, and therefore excellent power generation can be performed.

An average thickness of the intermediate layer formed of the rubber may be appropriately selected depending on the intended purpose without any limitation. The average thickness of the intermediate layer formed of the rubber is preferably in a range of from 1 μm through 10 mm, and more preferably from 50 μm through 200 μm in view of deformability. When the average thickness of the intermediate layer formed of the rubber is within the aforementioned preferable range, film formability can be ensured, the thickness of the intermediate layer does not inhibit deformation, and therefore excellent power generation can be performed.

The intermediate layer formed of the rubber is preferably insulating. As for the insulation properties, the intermediate layer preferably has volume resistivity of $10^8$ Ωcm or greater, and more preferably $10^{10}$ Ωcm or greater.

—Surface Modification Treatment and Deactivation Treatment—

Examples of a method for varying a movement amount of the intermediate layer formed of the rubber relative to the first electrode and the second electrode, or a method for varying a surface hardness of the intermediate layer include a surface modification treatment and a deactivation treatment. Both or either of the aforementioned treatments may be performed.

——Surface Modification Treatment——

Examples of the surface modification treatment include a plasma treatment, a corona discharge treatment, an electron beam irradiation treatment, a UV-ray irradiation treatment, an ozone treatment, and a radiation (e.g., X rays, $\alpha$-rays, $\beta$-rays, $\gamma$-rays, and neutrons) irradiation treatment. Among the above-listed surface modification treatments, the plasma treatment, the corona discharge treatment, and the electron beam irradiation treatment are preferable in view of processing speed of the aforementioned treatments. However, the surface modification treatment is not limited to the aforementioned examples, as long as the surface modification treatment is a treatment to apply a certain degree of irradiation energy to be able to modify a material.

———Plasma Treatment———

A plasma generating device for use in the plasma treatment is, for example, an atmospheric-pressure plasma device, a parallel-plate plasma device, a capacity-coupled plasma device, or an inductively-coupled plasma device. In view of durability of a treated intermediate layer, the plasma treatment is preferably a low-pressure plasma treatment.

Reaction pressure of the plasma treatment may be appropriately selected depending on the intended purpose without any limitation. The reaction pressure is preferably in a range of from 0.05 Pa through 100 Pa, more preferably from 1 Pa through 20 Pa.

A reaction atmosphere of the plasma treatment may be appropriately selected depending on the intended purpose without any limitation. For example, gas (e.g., inert gas, noble gas, and oxygen) is effective as the reaction atmosphere. The reaction atmosphere is preferably argon in view of continuity of an effect. Moreover, oxygen partial pressure of the reaction atmosphere is preferably 5,000 ppm or less. When the oxygen partial pressure of the reaction atmosphere is 5,000 ppm or less, generation of ozone can be suppressed, and use of an ozone processing device can be avoided.

An electricity radiation dose in the plasma treatment is defined by (output×irradiation duration). The electricity radiation dose is preferably in a range of from 5 Wh through 200 Wh, and more preferably from 10 Wh through 50 Wh. When the electricity radiation dose in the plasma treatment is within the aforementioned preferable range, an ability to generate electricity can be imparted to the intermediate layer, and durability of the intermediate layer can be ensured because an excessive amount of the energy is not applied.

———Corona Discharge Treatment———

Applied energy (cumulative energy) in the corona discharge treatment is preferably in a range of from 6 J/cm$^2$ through 300 J/cm$^2$, and more preferably from 12 J/cm$^2$ through 60 J/cm$^2$. When the applied energy in the corona discharge treatment is within the aforementioned preferable range, an ability to generate electricity can be imparted to the intermediate layer, and durability of the intermediate layer can be ensured because an excessive amount of the energy is not applied.

———Electron Beam Irradiation Treatment———

A radiation dose in the electron beam irradiation treatment is preferably 1 kGy or greater, and more preferably in a range of from 300 kGy through 10 MGy. When the radiation dose is within the aforementioned preferable range, an ability to generate electricity can be imparted to the intermediate layer formed of the rubber, and durability of the intermediate layer can be ensured because an excessive amount of the energy is not applied.

A reaction atmosphere of the electron beam irradiation treatment may be appropriately selected depending on the intended purpose without any limitation. The reaction atmosphere is preferably an atmosphere whose oxygen partial pressure is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

———UV-Ray Irradiation Treatment———

UV rays used in the UV-ray irradiation treatment preferably have wavelengths of from 200 nm through 365 nm, and more preferably from 240 nm through 320 nm.

Cumulative radiation in the UV-ray irradiation treatment is preferably in a range of from 5 J/cm$^2$ through 500 J/cm$^2$, and more preferably from 50 J/cm$^2$ through 400 J/cm$^2$. When the cumulative radiation in the UV-ray irradiation treatment is within the aforementioned preferable range, an ability to generate electricity can be imparted to the intermediate layer formed of the rubber, and durability of the intermediate layer can be ensured because an excessive amount of the energy is not applied.

A reaction atmosphere of the UV-ray irradiation treatment may be appropriately selected depending on the intended purpose without any limitation. The reaction atmosphere is preferably an atmosphere whose oxygen partial pressure is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

It is proposed in related art that an interlayer adhesion is enhanced by exciting or oxidizing a material through a plasma treatment, a corona discharge treatment, a UV-ray irradiation treatment, or an electron beam irradiation treatment to thereby generate active groups. The proposed techniques are however limited to the application between layers, and are not suitable for an outermost surface because lubricity is decreased. Moreover, a reaction of any of the aforementioned treatments is performed in an oxygen-rich state, to effectively introduce reaction active groups (hydroxyl groups). Accordingly, the aforementioned related art is fundamentally different from the surface modification treatment performed in the present invention.

The surface modification treatment is a treatment (e.g., a plasma treatment) that is performed in a reaction environment of a low oxygen content with reduced pressure. Therefore, the surface modification treatment accelerates re-cross-linking and bonding of the surface to improve durability, for example, owing to "an increase of Si—O bonds having high bonding energy." In addition, lubricity is increased owing to "densification by improved cross-link density" (although active groups are partially formed in the present invention, the active groups are deactivated by a below-described coupling agent or air dry treatment).

An average thickness of a surface-treated layer obtained by the surface modification treatment is preferably in a range of from 0.01 µm through 50 µm, and more preferably from 0.01 µm through 20.0 µm. When the average thickness of the surface-treated layer is within the aforementioned preferable range, an ability to generate electricity can be imparted to the intermediate layer formed of the rubber, and reduction in electric power generated due to increased hardness of the intermediate layer can be prevented.

——Deactivation Treatment——

A deactivation treatment may be optionally performed on a surface of the intermediate layer formed of the rubber, using various materials.

The deactivation treatment may be appropriately selected depending on the intended purpose without any limitation, as long as the deactivation treatment is a treatment for deactivating a surface of the intermediate layer formed of the rubber. Examples of the deactivation treatment include a treatment in which a deactivator is applied onto a surface of the intermediate layer. The deactivation means that active groups (e.g., —OH) generated by excitation or oxidation caused by a plasma treatment, a corona discharge treatment, a UV-ray irradiation treatment, or an electron beam irradiation treatment are allowed to react with a deactivator to decrease an activated degree of a surface of the intermediate layer, to thereby change the properties of the surface of the intermediate layer to properties that are unlikely to cause chemical reactions.

Examples of the deactivator include amorphous resins and coupling agents.

Examples of the amorphous resins include resins containing perfluoropolyether structures in main chains thereof.

Examples of the coupling agents include metal alkoxides, and solutions containing metal alkoxides. Examples of the metal alkoxides include compounds represented by the following general formula (1), partial hydrolysis polycondensation products thereof having a degree of polymerization of from about 2 through about 10, and mixtures thereof.

$R^1_{(4-n)}Si(OR^2)_n$  General formula (1)

In the general formula (1), $R^1$ and $R^2$ are each independently a straight-chain or branched alkyl group having from 1 through 10 carbon atoms, an alkyl polyether chain, and an aryl group, and n is an integer of from 2 through 4.

Examples of the compound represented by the general formula (1) include dimethyldimethoxysilane, diethyldiethoxysilane, diethyldimethoxysilane, diethyldiethoxysilane, diphenyldimethoxysilane, diphenyldiethoxysilane, methyltrimethoxysilane, methyltriethoxysilane, tetramethoxysilane, tetraethoxysilane, and tetrapropoxysilane. Among the above-listed compounds, tetraethoxysilane is preferable in view of durability.

In the general formula (1), $R^1$ may be a fluoroalkyl group, or a fluoroalkyl acrylate group or a perfluoropolyether group bonded via oxygen. Among the above-listed examples, $R^1$ is preferably a perfluoropolyether group in view of flexibility and durability.

Examples of the metal alkoxide include vinyl silanes [e.g., vinyltris(β-methoxyethoxy)silane, vinyl triethoxy silane, and vinyl trimethoxy silane], acryl silanes [e.g., γ-methacryloxypropyltrimethoxysilane], epoxy silanes [e.g., β-(3,4-epoxycyclohexynethyltrimethoxysilane, γ-glycidoxypropyltrimethoxysilane, and γ-glycidoxypropylmethyldiethoxysilane], and aminosilanes [e.g., N-β(aminoethyl)γ-aminopropyltrimethoxysilane, N-β(aminoethyl)γ-aminopropylmethyldimethoxysilane, γ-aminopropyltriethoxysilane, and N-phenyl-γ-aminopropyltrimethoxysilane].

As a metal atom in the metal alkoxide, other than Si, one or two or more selected from the group consisting of Ti, Sn, Al, and Zr may be used alone or in combination.

For example, the deactivation treatment can be performed by, after performing the surface modification treatment on a precursor of the intermediate layer formed of the rubber, applying the deactivator onto a surface of the precursor of the intermediate layer formed of the rubber through coating or dipping to impregnate the precursor with the deactivator.

In the case where silicone rubber is used as the precursor of the intermediate layer formed of the rubber, the surface may be deactivated by leaving the intermediate layer precursor to stand in air for air drying, after performing the surface modification treatment.

<<Space>>

The electricity-generating element preferably contains a space between the intermediate layer formed of the rubber and at least one of the first electrode and the second electrode. Owing to the space disposed, an electrostatic capacity of the electricity-generating element changes even with small vibrations, to increase a quantity of electric power generated.

A method for disposing the space may be appropriately selected depending on the intended purpose without any limitation. Examples of the method include a method where a spacer is disposed between the intermediate layer formed of the rubber and at least one of the first electrode and the second electrode.

—Spacer—

A material, a form, a shape, and a size of the spacer may be appropriately selected depending on the intended purpose without any limitation.

Examples of the material of the spacer include polymer materials, rubber, metals, conductive polymer materials, and conductive rubber compositions.

Examples of the polymer materials include polyethylene, polypropylene, polyethylene terephthalate, polyvinyl chloride, polyimide resins, fluororesins, and acrylic resins.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the metals include gold, silver, copper, iron, aluminium, stainless steel, tantalum, nickel, and phosphor bronze.

Examples of the conductive polymer materials include polythiophene, polyacetylene, and polyaniline.

Examples of the conductive rubber compositions include compositions containing conductive filler and rubber. Examples of the conductive filler include carbon materials (e.g., Ketjenblack, acetylene black, graphite, carbon fibers, carbon fiber composite materials, carbon nanofibers, and carbon nanotubes), metals (e.g., gold, silver, platinum, copper, iron, aluminium, and nickel), conductive polymer materials (e.g., derivatives of any of polythiophene, polyacetylene, polyaniline, polypyrrole, poly(p-phenylene), and poly (p-phenylene)vinylene, or the derivatives doped with a dopant, such as anions, and cations), and ionic liquids. Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the form of the spacer include a sheet, a film, fabric, nonwoven fabric, a mesh, and a sponge.

A shape, a size, an average thickness, and an installation position of the spacer may be appropriately selected depending on a structure of the electricity-generating element.

<Other Members>

The aforementioned other members may be appropriately selected depending on the intended purpose without any limitation. Examples of the other members include a sealing layer.

<<Sealing Layer>>

The sealing layer can be disposed on surfaces of the first electrode and the second electrode opposite to surfaces of the first electrode and the second electrode facing the intermediate layer.

The sealing layer may be appropriately selected depending on the intended purpose without any limitation. Examples of the sealing layer include tapes, resin films, rubber, metals, and ceramics. Examples of the tapes include cellophane tapes, polyimide tapes, and polytetrafluoroethylene tapes.

The intermediate layer formed of the rubber preferably does not have initial surface potential in a stationary state.

Note that, the initial surface potential of the intermediate layer can be measured under the following measuring conditions. In the present specification, the phrase "not having initial surface potential" means that surface potential as measured under the following conditions is ±10 V or less.
[Measuring Conditions]
Pretreatment: After leaving to stand in an atmosphere having a temperature of 30° C. and relative humidity of 40% for 24 hours, charge neutralization is performed for 60 seconds (by means of SJ-F300 available from Keyence Corporation).
Device: Treck Model 344
Measuring probe: 6000B-7C
Measuring distance: 2 mm
Measuring spot diameter: 10 mm in diameter
<Coupling Unit>

The coupling unit is a unit configured to couple the plurality of electricity-generating elements to each other, and is configured to apply an external force to at least one of the electricity-generating elements to bring the first electrode and the second electrode of the at least one of the electricity-generating elements close to each other. As a result, a distance between the first electrode and the second electrode of the electricity-generating element to which an external force is not applied is increased by the coupling unit. The coupling unit has functions of transmitting an external force between the electricity-generating elements, as well as coupling the electricity-generating elements to each other. The functions of the coupling unit can realize power generation of the electricity-generation element, to which an external force is not applied, as well as apply an external force to one or more of the electricity-generating elements to generate electricity.

The number of the coupling units disposed, and a material, shape, and size of each coupling unit may be appropriately selected depending on the intended purpose without any limitation.

The number of the electricity-generating elements is a plural number, preferably 2 or greater, and more preferably 2 or greater but 5 or less.

Materials of the intermediate layers in the electricity-generating elements may be identical or different. Specifically, an intermediate layer of the electricity-generating element, to which an external force is applied, and an intermediate layer of the electricity-generating element, to which an external force is not applied, may be formed of different materials.

The phrase "bringing close" means that a distance between the first electrode and the second electrode is shortened, and includes a case where the shortened distance is so small that it cannot be visually observed. The phrase "distance being increased" means a distance between the first electrode and the second electrode is elongated, and includes a case when an increase in the distance is so small that it cannot be visually observed.

<<Coupling Unit of First Embodiment>>

The coupling unit of the first embodiment is preferably a unit configured to transmit a force that is in a parallel and opposite direction relative to a direction of the external force applied to one electricity-generating element, to another electricity-generating element or other electricity-generating elements using a center of gravity of the coupling unit as a fulcrum. Use of such a coupling unit can efficiently transmit an external force applied to one electricity-generating element to another electricity-generating element(s) via the coupling unit.

A material, a shape, a size, and a structure of the coupling unit of the first embodiment may be appropriately selected depending on the intended purpose without any limitation.

Examples of the material of the coupling unit of the first embodiment include metals and resins. Examples of the metals include stainless steel, aluminium, iron, and copper. Examples of the resins include acrylic resins, vinyl chloride, and polypropylene.

Figure 3:
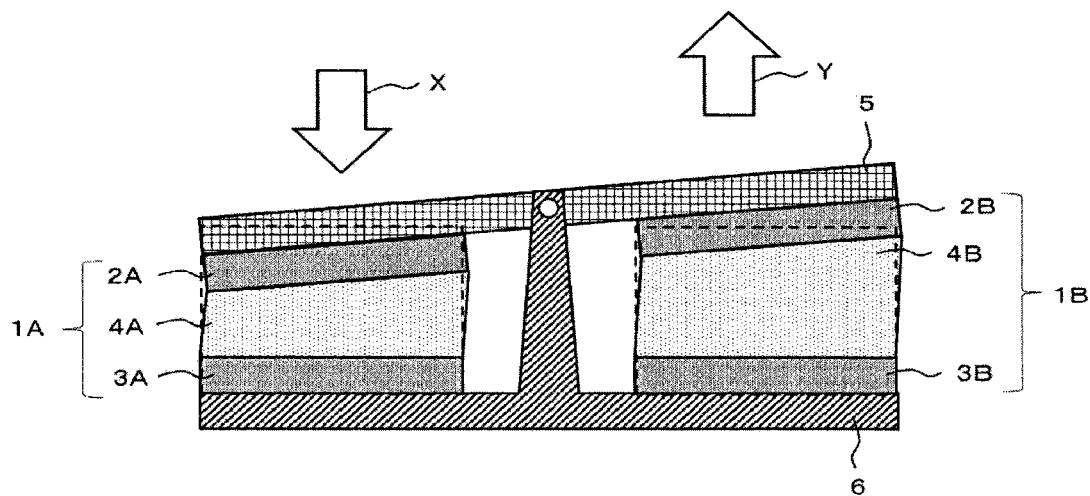
FIG. 3 is a schematic cross-sectional view illustrating another example of an electricity-generating element unit of the present invention.

One example of the coupling unit of the first embodiment is illustrated in FIG. 1. In FIG. 1, a first electrode 2A of an electricity-generating element 1A and a first electrode 2B of an electricity-generating element 1B are coupled to a supporting member 5, and a second electrode 3A of an electricity-generating element 1A and a second electrode 3B of an electricity-generating element 1B are coupled to a supporting member 6. An example where an external force is applied to the coupling unit of the first embodiment is illustrated in FIG. 3. When an external force is applied to an electricity-generating element 1A in the X direction, an intermediate layer 4A is deformed and the electricity-generating element 1A generates electricity. At the same time, a center of a supporting member 5 acts as a fulcrum to apply a force in the Y direction to an electricity-generating element 1B, to which the external force is not applied, to deform an intermediate layer 4B. As a result, the electricity-generating element 1B generates electricity.

When an external force is applied to the electricity-generating element 1B in the X direction, subsequently, the intermediate layer 4B is deformed to generate electricity. At the same time, the center of the supporting member 5 acts as a fulcrum to apply a force in the Y direction to an electricity-generating element 1A, to which the external force is not applied, to deform an intermediate layer 4A. As a result, the electricity-generating element 1A generates electricity. As described above, electricity can be generated continuously and efficiently by applying an external force, to thereby generate high electric power.

<<Coupling Unit of Second Embodiment>>

The coupling unit of the second embodiment is a member described below. There are a plurality of regions, each of the plurality of regions including the electricity-generating element, and a housing member housing the electricity-generating element. The plurality of regions are coupled to each other by the coupling unit in a manner that a fluid can move through the plurality of regions. When an external force is applied to at least one of the regions to bring the first electrode and the second electrode of the electricity-generating element of the at least one of the regions close to each other, the fluid is moved by the coupling unit to the region or each of the regions to which an external force is not applied, to increase a distance between the first electrode and the second electrode of the electricity-generating element of the region or each of the regions. Use of the aforementioned coupling unit can efficiently transmit an external force, which is applied to one region, to another region via the coupling unit.

A material, a shape, a size, and a structure of the coupling unit of the second embodiment may be appropriately selected depending on the intended purpose without any limitation.

Examples of the material of the coupling unit of the second embodiment include silicone rubber, polypropylene, and urethane. Among the above-listed materials, silicone rubber is preferable in view of flexibility and a texture for use.

The region includes the electricity-generating element, and a housing member housing the electricity-generating element. A shape, a size, and a structure of the housing member may be appropriately selected depending on the intended purpose.

Examples of the material of the housing member include metals, resins, rubber, cloth, wood, paper, and ceramics. Among the above-listed materials, resins are preferable in view of power-generating performance.

The coupling unit of the second embodiment preferably has a hollow part through which a fluid can move. Owing to the hollow part, a fluid can easily move between the regions.

The housing member is preferably a member in which a fluid can be sealed. When the housing member has the aforementioned structure, an external force is efficiently transmitted.

The housing member is preferably a member a volume of which can be changed. Use of such a member as the housing member can efficiently move a fluid inside the housing member.

The housing member is preferably a bag made of resin in view of flexibility and a texture for use.

Examples of the fluid include a liquid and a gas. The fluid is preferably a gas in view of power-generating performance.

Both of a conductive liquid and a insulation liquid are used as the liquid, but insulation liquid is preferable. When the liquid has conductivity, such liquid can be used as long as the liquid is insulated from an electrode. Examples of the conductive liquid include water, alcohols, ionic liquids, and liquid metals. Examples of the insulation liquid include silicone oil, hydrocarbons, polyether, and fatty acid esters. The above-listed liquids may be used alone or in combination.

The gas may be appropriately selected depending on the intended purpose without any limitation. Examples of the gas include air, dried air, nitrogen, helium, and nitrogen. The above-listed examples of the gas may be used alone or in combination. Among the above-listed examples of the gas, air and nitrogen are preferable, and nitrogen is more preferable.

Figure 2:
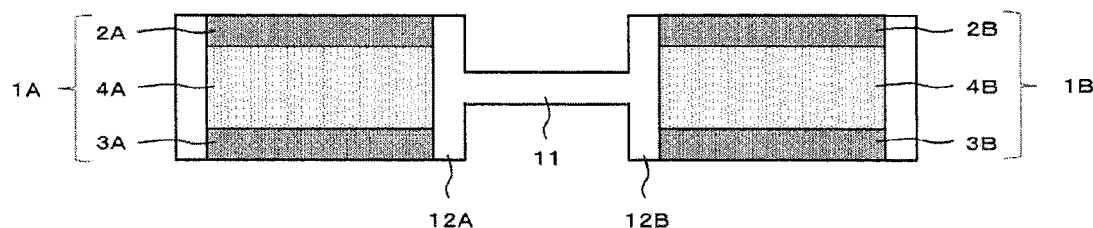
FIG. 2 is a schematic cross-sectional view illustrating another example of an electricity-generating element unit of the present invention.
Figure 4A:
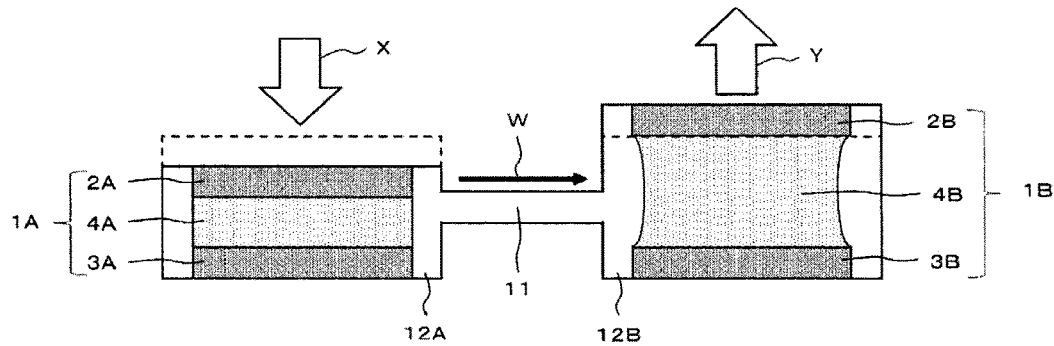
FIG. 4A is a schematic cross-sectional view illustrating another example of an electricity-generating element unit of the present invention.

FIG. 2 is a schematic view illustrating one example of the coupling unit of the second embodiment. In FIG. 2, a region 12A including an electricity-generating element 1A and a housing member housing the electricity-generating element 1A, and a region 12B including an electricity-generating element 1B and a housing member housing the electricity-generating element 1B are coupled together with a supporting member 11. One example where an external force is applied to the coupling unit of the second embodiment is illustrated in FIG. 4A. When an external force is applied to an electricity-generating element 1A in the X direction, an intermediate layer 4A is deformed to generate electricity. At the same time, a fluid in the region 12A enters into a region 12B through a supporting member 11 in the W direction, to increase a volume of the region 12B. As a result, a force is applied to an electricity-generating element 1B in the Y direction. A distance between a first electrode 2B and a second electrode 3B is increased by applying the force to the electricity-generating element 1B in the Y direction, and the intermediate layer 4B is deformed to generate electricity.

Figure 4B:
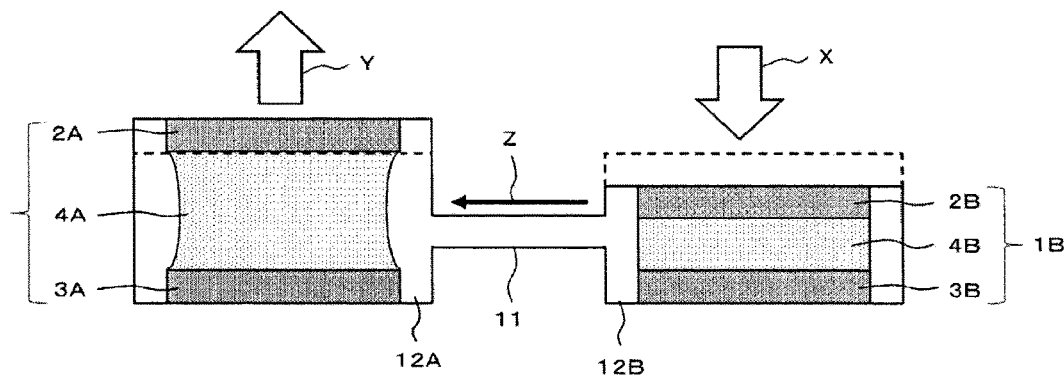
FIG. 4B is a schematic cross-sectional view illustrating another example of an electricity-generating element unit of the present invention.

When an external force is applied to the region 12B in the X direction as illustrated in FIG. 4B, subsequently, the intermediate layer 4B is deformed to generate electricity. At the same time, the fluid is moved in the Z direction to apply a force to the region 12A in the Y direction. As a result, a distance between a first electrode 2A and a second electrode 3A is increased, and the intermediate layer 4A is deformed to generate electricity. As described above, electricity can be generated continuously and efficiently by applying an external force, to thereby generate high electric power.

Figure 5:
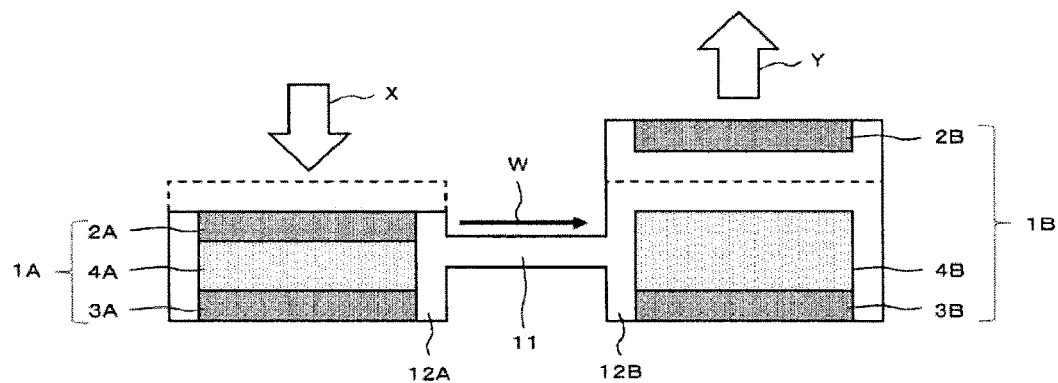
FIG. 5 is a schematic cross-sectional view illustrating another example of an electricity-generating element unit of the present invention.
Figure 6:
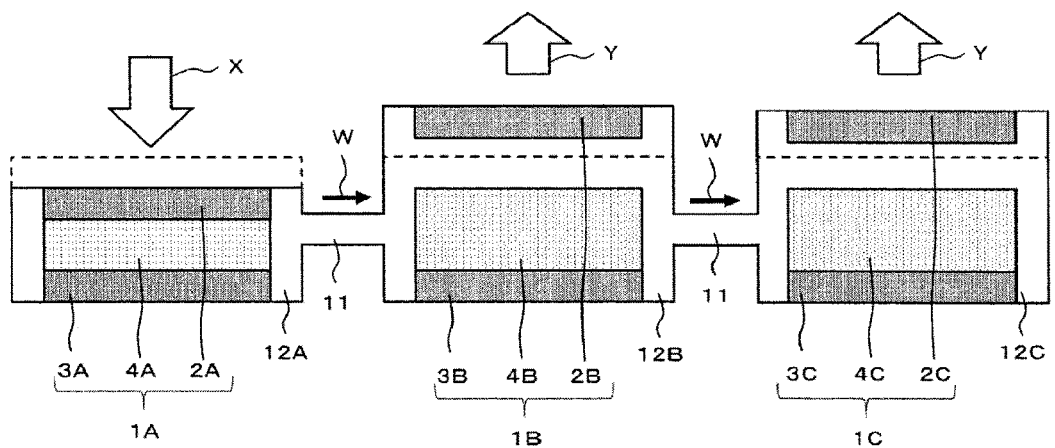
FIG. 6 is a schematic cross-sectional view illustrating another example of an electricity-generating element unit of the present invention.

When a distance between the first electrode 2 and the second electrode 3 is increased, a distance between the intermediate layer 4 and the first electrode 2 or the second electrode 3 of the electricity-generating element 1 may be unchanged as illustrated in FIGS. 4A and 4B, or may be increased as illustrated in FIG. 5. A preferable structure is a structure where the intermediate layer is completely separated from the first electrode or the second electrode, as illustrated in FIG. 5. The number of the electricity-generating elements to be coupled may be appropriately selected depending on the intended purpose, and the number may be two as in FIGS. 4 and 5, three as in FIGS. 6 and 7, or greater than three.

(Electric Generator)

An electric generator of the present invention includes at least the electricity-generating element unit, and may further include other members, if necessary. The electric generator does not require application of high voltage at the time of an operation because the electricity-generating element unit is used.

The electric generator generates electricity owing to a function of the intermediate layer of the electricity-generating element, when a load is externally applied. A principle of the power generation varies depending on a material of the intermediate layer.

The electric generator has a mechanism that, when electrodes of at least one of the electricity-generating elements are brought close to each other by the coupling unit, in connection with the aforementioned movement, a distance between electrodes of another electricity-generating element or other electricity-generating elements is increased.

<Other Members>

The aforementioned other members may be appropriately selected depending on the intended purpose without any limitation. Examples of the other members include cover materials, electric wires, and electric circuits.

<<Cover Material>>

The cover material may be appropriately selected depending on the intended purpose without any limitation.

Examples of a material of the cover material include polymer materials and rubber. Examples of the polymer materials include polyethylene, polypropylene, polyethylene terephthalate, polyvinyl chloride, polyimide resins, fluororesins, and acrylic resins. Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

A structure, a shape, a size, and an average thickness of the cover material are not particularly limited and may be appropriately selected depending on the electric generator. The cover material may be used to sandwich the electric generator, or cover the entire electric generator.

<<Electric Wires>>

The electric wires may be appropriately selected depending on the intended purpose without any limitation.

Examples of a material of the electric wires include metals and alloys. Examples of the metals include gold, silver, copper, aluminium, and nickel.

A structure, a shape, and a thickness of each electric wire are not particularly limited and may be appropriately selected depending on the electric generator.

<<Electric Circuits>>

The electric circuits may be appropriately selected depending on the intended purpose without any limitation, as long as the electric circuits are circuits for drawing electricity generated by the element.

Examples of the electric circuits include rectifier circuits, oscilloscopes, voltmeters, ammeters, storage circuits, LEDs, and various sensors (e.g., ultrasonic sensors, pressure sensors, tactile sensors, distortion sensors, acceleration sensors, shock sensors, vibration sensors, pressure-sensitive sensors, electric field sensors, and sound pressure sensors).

<Use>

The electric generator is suitably used for various sensors, such as ultrasonic sensors, pressure sensors, tactile sensors, distortion sensors, acceleration sensors, shock sensors, vibration sensors, pressure-sensitive sensors, electric field sensors, and sound pressure sensors, and is particularly suitably used for wearable sensors, because application of high voltage is not required. Moreover, the electric generator is suitably used as a piezoelectric film having excellent processability in head phones, speakers, microphones, hydrophones, displays, fans, pumps, variable focal lenses, ultrasonic transducers, piezoelectric transformers, sound insulators, soundproofing materials, actuators, or keyboards. Moreover, the electric generator can be used for audio systems, information processing devices, measuring devices, medical devices, vehicles, buildings, damping materials (dampers) used for sports equipment, such as ski, and rackets, and other fields.

Furthermore, the electric generator is suitably used for the following applications.

Generation of electricity using natural energy, such as wave power, water power, and wind power.

Generation of electricity using vibrations caused by walking by humans, when the electric generator is embedded in shoes, clothes, floors, or accessories.

Generation of electricity using vibrations caused by traveling, when the electric generator is embedded in tires of automobiles.

Moreover, the electric generator is expected to be applied as a plate electric generator prepared by forming the electric generator on a flexible substrate, a secondary battery that is charged by applying voltage, or a novel actuator (e.g., artificial muscles).

(Footwear)

Footwear of the present invention includes at least the electric generator. Examples of the footwear include sneakers, leather shoes, pumps, high heels, slip-on shoes, sandals, slippers, boots, climbing shoes, sports shores, walking shoes, running shoes, room shoes, geta clogs, flip flaps, and tabi.

Figure 8:
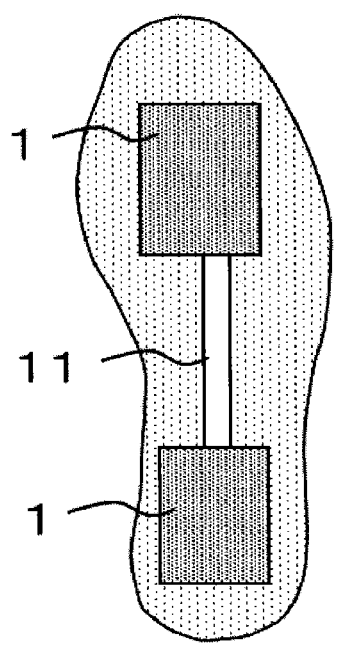
FIG. 8 is a schematic view illustrating one example of an insole of footwear of the present invention.
Figure 9:
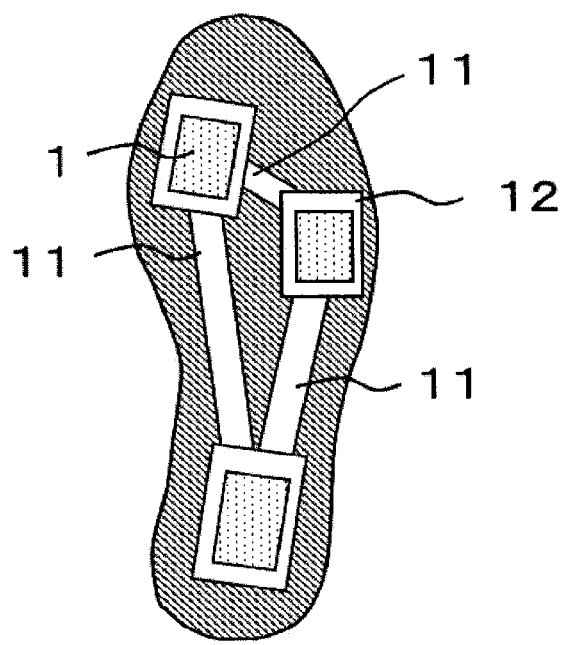
FIG. 9 is a schematic view illustrating another example of an insole of footwear of the present invention.
Figure 11:
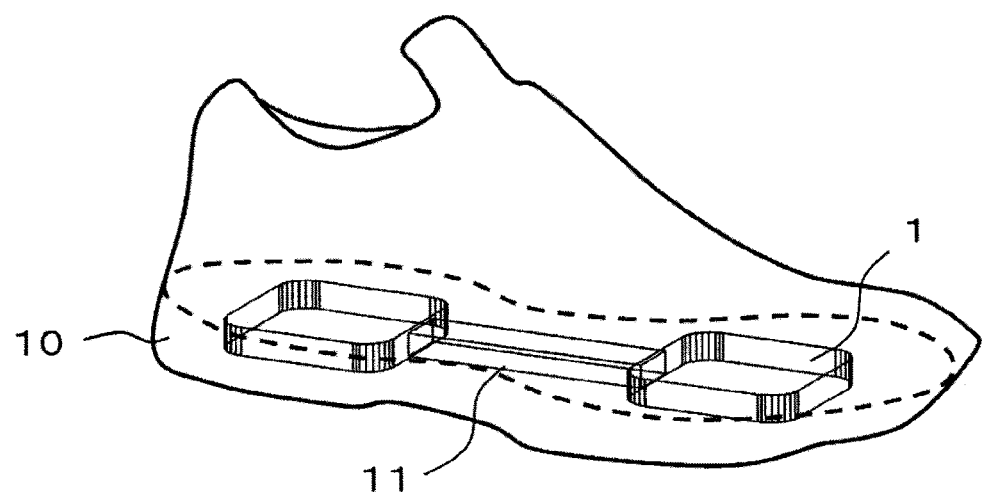
FIG. 11 is a schematic view illustrating one example of footwear of the present invention.

The installation positions of the electric generators in the footwear are not particularly limited, as long as the installation positions are positions where loads are applied to the electricity-generating elements in the electric generator. As illustrated in FIG. 11, the electric generators preferably disposed in an inner side of an insole, a midsole, or an outer sole. The number of the electricity-generating elements disposed in the footwear is not particularly limited. The number of the electricity-generating elements disposed in the footwear is not particularly limited. In view of power generation efficiency, the number is preferably one in each of a heel area and a toe area, as illustrated in FIG. 8, or one in a heel area, and two in a toe area, as illustrated in FIG. 9.

The electric generator in the footwear may be covered with a member to house the electric generator.

A material, a form, a size, and a structure of the member to house the electric generator may be appropriately selected depending on the intended purpose.

(Flooring Material)

A flooring material of the present invention includes at least the electric generator. A type and a shape of the flooring material, a layout pattern of the electric generators, and installation positions of the electric generators are not particularly limited, as long as the flooring material includes at least the electric generator at a part of the flooring material.

Examples of the type of the flooring material include metals, plastics, rubber, cloth, stone, ceramics, glass, and cement.

Examples of the shape of the flooring material include square plate shapes and square cloth.

Figure 12A:
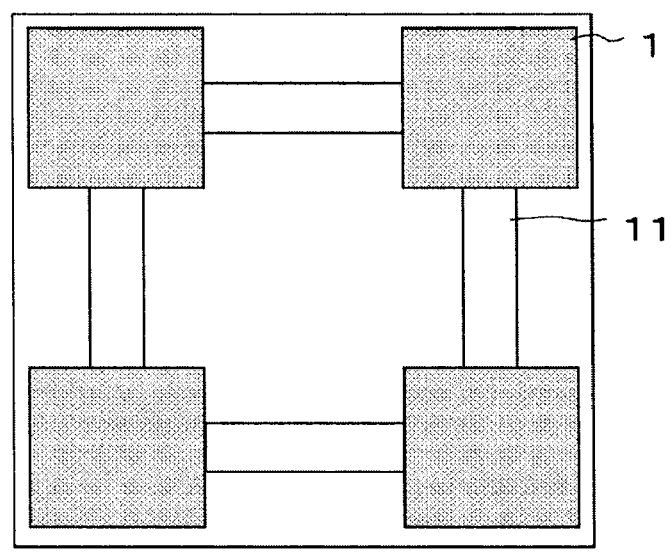
FIG. 12A is a schematic view illustrating one example of a flooring material of the present invention.
Figure 12B:
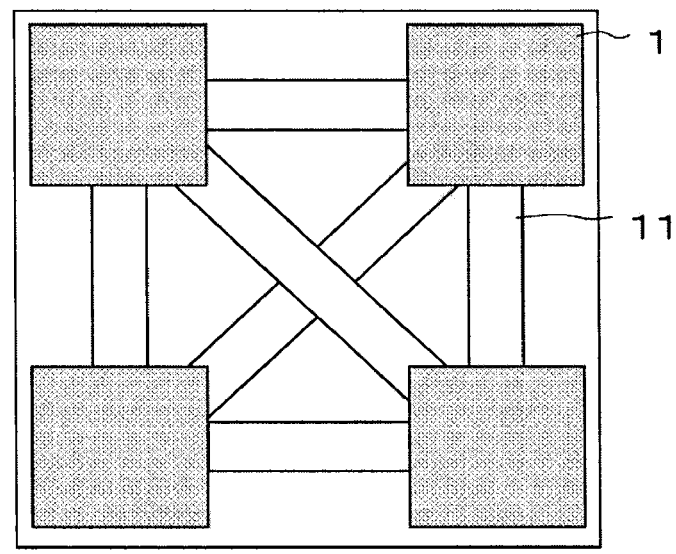
FIG. 12B is a schematic perspective view illustrating one example of a flooring material of the present invention.

Examples of the layout patterns of the electric generator include the layout patterns illustrated in FIGS. 12A and 12B.

Figure 13:
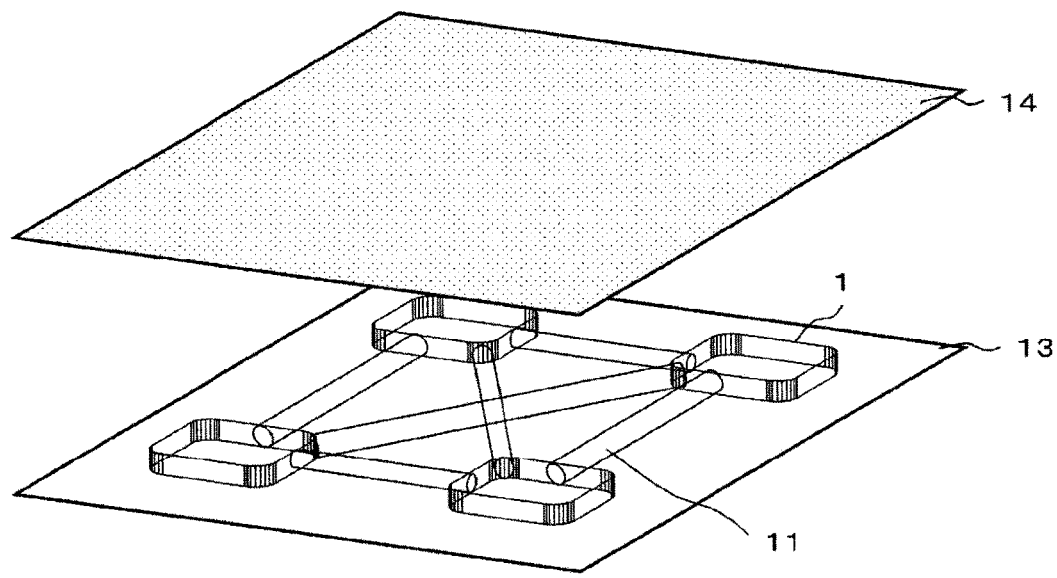
FIG. 13 is a schematic perspective view illustrating one example of a flooring material of the present invention.

The installation positions of the electric generators may be appropriately selected depending on the intended purpose, as long as the installation positions are positions where loads are applied during walking. For example, the electric generator may be disposed between a floor-surface constituting member 14 and a floor base, as illustrated in FIG. 13, or the electric generator may be embedded in a flooring material.

<Wearing Product>

A wearing product includes at least the electric generator. Examples of the wearing product include supporters. The electric generator of the present invention is attached to a wearing product, and electricity can be generated when the wearing product is worn, followed by walking.

Types of the supporters, and installation positions of the electric generator are not particularly limited. Examples of positions at which the supporters are used include joint areas such as elbows and knees.

Examples of the types of the supporters include supporters for sports, and medical supporters.

Figure 14:
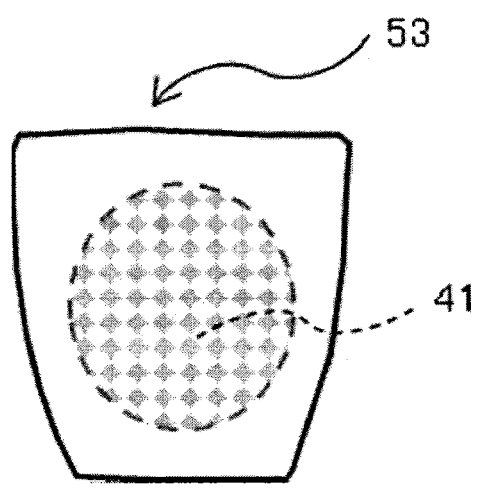
FIG. 14 is a schematic view illustrating one example of a knee supporter.

The installation positions of the electric generators are not limited as long as the installation positions are positions where loads are applied during walking. For example, the installation positions are preferably the whole surface or part (a front knee area or a back knee area) of inner sides of the supporters. FIG. 14 is a perspective plan view illustrating one example where the electric generator of the present invention is attached to a knee supporter. The knee supporter 53 illustrated in FIG. 14 has a structure where the electric generator 41 of the present invention is attached to a front knee area.

EXAMPLES

The present invention will next be described by way of Examples, but the present invention is not limited to these Examples. In the following descriptions, the unit "part(s)" denotes "part(s) by mass" and the unit "%" denotes "% by mass," unless otherwise stated.

Comparative Example 1

<Production of Electricity-Generating Element Unit and Electric Generator>

Figure 10:
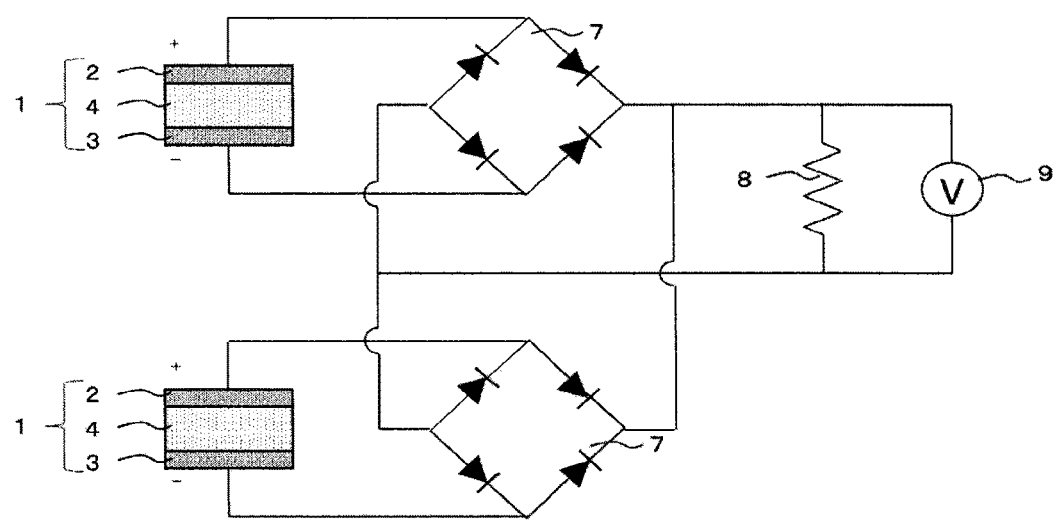
FIG. 10 is a schematic view illustrating one example of an electric generator of the present invention.

Two piezoelectric ceramics (PZT, L-2H available from Lead Techno, electrode: Au) each having a size of 40 mm×40 mm and an average thickness of 0.5 mm were prepared. The electricity-generating elements were respectively disposed in a toe area and a heel area of an insole. Each of the two electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), to thereby produce an electric generator of Comparative Example 1. A connection wiring of the electricity-generating elements was as illustrated in FIG. 10.

<Evaluation Method>

The electric generator of Comparative Example 1 was disposed inside one of a pair of sneakers (ML574 (VGY), 27 cm, available from New Balance), to thereby prepare an evaluation sample.

An evaluator (body weight: 63 kg) put the sneaker equipped with the electric generator on the right foot, and walked at a pace of 2 steps per second (2 Hz) in the state where the lead wire was coupled to the oscilloscope, to thereby determine a wave shape of the walking for 1 step after the second step. Cumulative energy was calculated from the obtained wave shape.

Example 1

<Production of Electricity-Generating Element Unit and Electric Generator>

As a coupling unit, supporting members 5 and 6 as illustrated in FIG. 1 were each produced with an acrylic resin plate in a size of 190 mm×15 mm×2 mm. A fulcrum was disposed at a center of gravity of the supporting member 5 to create a structure that could move up and down. Electricity-generating elements identical to those in Comparative Example 1 were respectively positioned at the same distance from the center of gravity of the supporting member 5, and were bonded using double-sided tape (Nicetack, available from NICHIBAN CO., LTD.). In the aforementioned manner, the supporting member 5 and the second electrode 3 were bonded together, and the supporting member 6 and the first electrode 2 were similarly bonded together, to thereby produce an electricity-generating element unit, in which the two electricity-generating elements were sandwiched between the supporting members 5 and 6. The electricity-generating element unit was arranged in an insole in a manner that the electricity-generating elements of the electricity-generating element unit were placed in the same positions as in Comparative Example 1, to thereby produce an electric generator of Example 1.

<Evaluation Method>

Cumulative energy of the electric generator of Example 1 was evaluated in the same manner as in Comparative Example 1, and power-generating performance of the electric generator of Example 1 was evaluated by a rank based on the following evaluation criteria. The result is presented in Table 2.

[Evaluation Criteria]

Rank A: power-generating performance was improved 10 times or greater the cumulative energy of Comparative Example 1.

Rank B: power-generating performance was improved 5 times or greater but less than 10 times the cumulative energy of Comparative Example 1.

Rank C: power-generating performance was improved 3 times or greater but less than 5 times the cumulative energy of Comparative Example 1.

Rank D: power-generating performance was improved greater than 1 time but less than 3 times the cumulative energy of Comparative Example 1.

Example 2

<Production of Electricity-Generating Element Unit and Electric Generator>

A bag with a zip (made of nylon (NA)/polyethylene (PE), Lamizip LZ-9, available from SEISANNIPPONSHA LTD.) in a size of 115 mm×90 mm was used as a housing member. One electricity-generating element identical to that of Comparative Example 1 was housed in the housing member. The first electrode and the second electrode were bonded to an inner side of the bag with double-sided tape (Nicetack, available from NICHIBAN CO., LTD.). In the manner as described, two regions each including the electricity-generating element and the housing member housing the electricity-generating element were produced.

Figure 7:
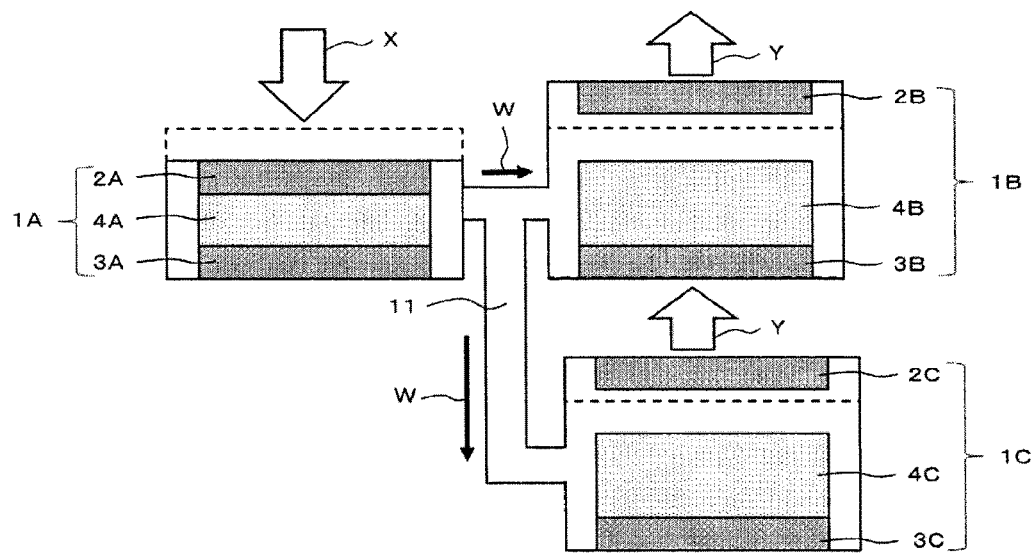
FIG. 7 is a schematic cross-sectional view illustrating another example of an electricity-generating element unit of the present invention.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 2.

<Evaluation Method>

Cumulative energy of the electric generator of Example 2 was evaluated in the same manner as in Example 1, and power-generating performance of the electric generator of Example 2 relative to Comparative Example 1 was evaluated by a rank. The result is presented in Table 2.

Example 3

<Production of Electricity-Generating Element Unit and Electric Generator>

An electric generator of Example 3 was produced in the same manner as in Example 2, except that the air sealed in the regions and in the coupling unit was replaced with nitrogen.

<Evaluation Method>

Cumulative energy of the electric generator of Example 3 was evaluated in the same manner as in Example 1, and power-generating performance of the electric generator of Example 3 relative to Comparative Example 1 was evaluated by a rank. The result is presented in Table 2.

Example 4

<Production of Electricity-Generating Element Unit and Electric Generator>

An electric generator of Example 4 was produced in the same manner as in Example 2, except that a hole was made in the region of the electricity-generating element unit, propylene glycol (PG, available from Wako Pure Chemical Industries, Ltd.), which was an insulating liquid, was injected by a syringe with preventing inclusion of air in a manner that an amount of the insulating liquid was to be about 80% of a fluid retaining capacity of the electricity-generating element unit, and the hole was sealed with a silicone sealing agent.

<Evaluation Method>

Cumulative energy of the electric generator of Example 4 was evaluated in the same manner as in Example 1, and power-generating performance of the electric generator of Example 4 relative to Comparative Example 1 was evaluated by a rank. The result is presented in Table 2.

Comparative Example 2

<Production of Electricity-Generating Element and Electric Generator>

A piezo film sheet (3-1004346-0, available from Tokyo Sensor Co., Ltd., average thickness: 100 μm, electrode: Ni/Cu) having polyvinylidene fluoride (PVDF) as an intermediate layer was prepared as each electricity-generating element. The electricity-generating elements were each coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), to thereby produce an electric generator of Comparative Example 2. A connection wiring of the electricity-generating elements was as illustrated in FIG. 10.

<Evaluation Method>

Cumulative energy of the electric generator of Comparative Example 2 was calculated in the same manner as in Comparative Example 1.

Example 5

<Production of Electricity-Generating Element Unit and Electric Generator>

As a coupling unit, supporting members 5 and 6 as illustrated in FIG. 1 were each produced with an acrylic resin plate in a size of 190 mm×15 mm×2 mm. A fulcrum was disposed at a center of gravity of the supporting member 5 to create a structure that could move up and down. Electricity-generating elements identical to those in Comparative Example 2 were respectively positioned at the same distance from the center of gravity of the supporting member 5, and were bonded using double-sided tape (Nicetack, available from NICHIBAN CO., LTD.). In the aforementioned manner, the supporting member 5 and the second electrode 3 were bonded together, and the supporting member 6 and the first electrode 2 were similarly bonded together, to thereby produce an electricity-generating element unit, in which the two electricity-generating elements were sandwiched between the supporting members 5 and 6. The electricity-generating element unit was arranged in an insole in a manner that the electricity-generating elements of the electricity-generating element unit were placed in the same positions as in Comparative Example 2, to thereby produce an electric generator of Example 5.

<Evaluation Method>

Cumulative energy of the electric generator of Example 5 was evaluated in the same manner as in Comparative Example 2, and power-generating performance of the electric generator of Example 5 was evaluated by a rank based on the following criteria. The result is presented in Table 2.

[Evaluation Criteria]

Rank A: power-generating performance was improved 10 times or greater the cumulative energy of Comparative Example 2.

Rank B: power-generating performance was improved 5 times or greater but less than 10 times the cumulative energy of Comparative Example 2.

Rank C: power-generating performance was improved 3 times or greater but less than 5 times the cumulative energy of Comparative Example 2.

Rank D: power-generating performance was improved greater than 1 time but less than 3 times the cumulative energy of Comparative Example 2.

Example 6

<Production of Electricity-Generating Element Unit and Electric Generator>

A bag with a zip (made of nylon (NA)/polyethylene (PE), Lamizip LZ-9, available from SEISANNIPPONSHA LTD.) in a size of 115 mm×90 mm was used as a housing member. One electricity-generating element identical to that of Comparative Example 2 was housed in the housing member. The first electrode and the second electrode were bonded to an inner side of the bag with double-sided tape (Nicetack, available from NICHIBAN CO., LTD.). In the manner as described, two regions each including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 6.

<Evaluation Method>

Cumulative energy of the electric generator of Example 6 was evaluated in the same manner as in Example 5, and power-generating performance of the electric generator of Example 6 relative to Comparative Example 2 was evaluated by a rank. The result is presented in Table 2.

Example 7

<Production of Electricity-Generating Element Unit and Electric Generator>

An electric generator of Example 7 was produced in the same manner as in Example 6, except that the air sealed in the regions and in the coupling unit was replaced with nitrogen.

<Evaluation Method>

Cumulative energy of the electric generator of Example 7 was evaluated in the same manner as in Example 5, and power-generating performance of the electric generator of Example 7 relative to Comparative Example 2 was evaluated by a rank. The result is presented in Table 2.

Example 8

<Production of Electricity-Generating Element Unit and Electric Generator>

An electric generator of Example 8 was produced in the same manner as in Example 6, except that a hole was made in the region of the electricity-generating element unit, propylene glycol (PG, available from Wako Pure Chemical Industries, Ltd.), which was an insulating liquid, was injected by a syringe with preventing inclusion of air in a manner that an amount of the insulating liquid was to be about 80% of a fluid retaining capacity of the electricity-generating element unit, and the hole was sealed with a silicone sealing agent.

<Evaluation Method>

Cumulative energy of the electric generator of Example 8 was evaluated in the same manner as in Example 5, and power-generating performance of the electric generator of Example 8 relative to Comparative Example 2 was evaluated by a rank. The result is presented in Table 2.

Comparative Example 3

<Production of Electricity-Generating Element and Electric Generator>

—Formation of Intermediate Layer—

An electret material (CYTOP: CTL-809A, available from ASAHI GLASS CO., LTD.) was applied by spin coating on a stainless steel plate having an average thickness of 0.5 mm and a size of 40 mm×40 mm (SUS301, available from MISUMI Corporation). After leaving to stand for 30 minutes at a room temperature (23° C.), the resultant was pre-cured for 1 hour at 50° C. and post-cured for 1 hour at 300° C. in an oven (DN410H, available from Yamato Scientific Co., Ltd.), to thereby form an electret material film having an average thickness of 10 μm.

A corona discharge treatment was performed on the electret material film using a corona charger under the following conditions, to thereby produce an intermediate layer.

The corona charger contains a corona needle and electrodes disposed to face each other, and enables discharges with a DC high voltage power supply (HAR-20R5, available from Matsusada Precision Inc.). Moreover, a grid was disposed between the corona needle and the electrodes. Voltage is applied to the grid from a power source of the grid.

[Charging Conditions]
Corona needle voltage: −10 kV
Grid voltage: −1 kV
Plate temperature: 100° C.

—Production of Electricity-Generating Element and Electric Generator—

The intermediate layer was sandwiched between stainless steel plates (SUS301 plates, 40 mm×40 mm×0.5 mm) serving as a first electrode and a second electrode, to thereby obtain an electricity-generating element having the electret material as the intermediate layer. The electricity-generating element was coupled with a lead wire (C3/RV-90 0.75SQ, available from Taiyo Cabletec Corporation) and to an oscilloscope (WaveAce1001 available from Teledyne LeCroy Japan Corporation, resistance: 1 MΩ), to thereby produce an electric generator of Comparative Example 3. A connection wiring of the electricity-generating elements was as illustrated in FIG. 10.

<Evaluation Method>

Cumulative energy of the electric generator of Comparative Example 3 was calculated in the same manner as in Comparative Example 1.

Example 9

<Production of Electricity-Generating Element Unit and Electric Generator>

As a coupling unit, supporting members 5 and 6 as illustrated in FIG. 1 were each produced with an acrylic resin plate in a size of 190 mm×15 mm×2 mm. A fulcrum was disposed at a center of gravity of the supporting member 5 to create a structure that could move up and down. Electricity-generating elements identical to those in Comparative Example 1 were respectively positioned at the same distance from the center of gravity of the supporting member 5, and were bonded using double-sided tape (Nicetack, available from NICHIBAN CO., LTD.). In the aforementioned manner, the supporting member 5 and the second electrode 3 were bonded together, and the supporting member 6 and the first electrode 2 were similarly bonded together, to thereby produce an electricity-generating element unit, in which the two electricity-generating elements were sandwiched between the supporting members 5 and 6. The electricity-generating element unit was arranged in an insole in a manner that the electricity-generating elements of the electricity-generating element unit were placed in the same positions as in Comparative Example 3, to thereby produce an electric generator of Example 9.

<Evaluation Method>

Cumulative energy of the electric generator of Example 9 was evaluated in the same manner as in Comparative Example 3, and power-generating performance of the electric generator of Example 9 was evaluated by a rank based on the following evaluation criteria. The result is presented in Table 2.

[Evaluation Criteria]

Rank A: power-generating performance was improved 10 times or greater the cumulative energy of Comparative Example 3.

Rank B: power-generating performance was improved 5 times or greater but less than 10 times the cumulative energy of Comparative Example 3.

Rank C: power-generating performance was improved 3 times or greater but less than 5 times the cumulative energy of Comparative Example 3.

Rank D: power-generating performance was improved greater than 1 time but less than 3 times the cumulative energy of Comparative Example 3.

Example 10

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. An electricity-generating element, in which a material of the intermediate layer was identical to that of Comparative Example 3 but the intermediate layer was not bonded to a second electrode, was housed in the housing member. A first electrode and the second electrode were bonded to an inner side of the bag with double-sided tape (Nicetack, available from NICHIBAN CO., LTD.). In the manner as described, two regions each including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 10.

When a downward force was applied to one of the regions, the second electrode was completely released from the intermediate layer in the other region because the intermediate layer and the second electrode were not bonded together.

<Evaluation Method>

Cumulative energy of the electric generator of Example 10 was evaluated in the same manner as in Example 9, and power-generating performance of the electric generator of Example 10 relative to Comparative Example 3 was evaluated by a rank. The result is presented in Table 2.

Example 11

<Production of Electricity-Generating Element Unit and Electric Generator>

An electric generator of Example 11 was produced in the same manner as in Example 10, except that the air sealed in the regions and in the coupling unit was replaced with nitrogen.

<Evaluation Method>

Cumulative energy of the electric generator of Example 11 was evaluated in the same manner as in Example 9, and power-generating performance of the electric generator of Example 11 relative to Comparative Example 3 was evaluated by a rank. The result is presented in Table 2.

Example 12

<Production of Electricity-Generating Element Unit and Electric Generator>

An electric generator of Example 12 was produced in the same manner as in Example 10, except that the air sealed in the regions and in the coupling unit was replaced with propylene glycol (PG, available from Wako Pure Chemical Industries, Ltd.).

<Evaluation Method>

Cumulative energy of the electric generator of Example 12 was evaluated in the same manner as in Example 9, and power-generating performance of the electric generator of Example 12 relative to Comparative Example 3 was evaluated by a rank. The result is presented in Table 2.

Comparative Example 4

<Production of Electricity-Generating Element and Electric Generator>

—Formation of Intermediate Layer—

Into 100 parts of silicone rubber (TSE3033, available from Momentive Performance Materials Inc.), 40 parts of barium titanate (93-5640, available from Wako Pure Chemical Industries, Ltd.) were blended as an additive. The obtained mixture was applied onto a polyethylene terephthalate (PET) film through blade coating to give an average thickness of 150 μm±20 μm, and a size of 40 mm (length)×40 mm (width), to thereby obtain an intermediate layer precursor.

—Surface Modification Treatment—

After baking the intermediate layer precursor for 30 minutes at about 120° C., a plasma treatment was performed as a surface modification treatment under the following conditions, to thereby obtain an intermediate layer.

[Plasma Treatment Conditions]

Device: PR-500, available from Yamato Scientific Co., Ltd.
Output: 100 W
Treatment duration: 4 minutes
Reaction atmosphere: argon (99.999%)
Reaction pressure: 10 Pa —Production of Electricity-Generating Element and Electric Generator—

The obtained intermediate layer was sandwiched between a pair of aluminium sheets (available from Mitsubishi Aluminum Co., Ltd.) each having an average thickness of 12 μm, serving as a first electrode and a second electrode, to thereby obtain an electricity-generating element having an intermediate layer of a silicone rubber material. The prepared electricity-generating element was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), to thereby produce an electric generator of Comparative Example 4. A connection wiring of the electricity-generating elements was as illustrated in FIG. 10.

<Evaluation Method>

Cumulative energy of the electric generator of Comparative Example 4 was calculated in the same manner as in Comparative Example 1.

Example 13

<Production of Electricity-Generating Element Unit and Electric Generator>

As a coupling unit, supporting members 5 and 6 as illustrated in FIG. 1 were each produced with an acrylic resin plate in a size of 190 mm×15 mm×2 mm. A fulcrum was disposed at a center of gravity of the supporting member 5 to create a structure that could move up and down. Electricity-generating elements identical to those in Comparative Example 1 were respectively positioned at the same distance from the center of gravity of the supporting member 5, and were bonded using double-sided tape (Nicetack, available from NICHIBAN CO., LTD.). In the aforementioned manner, the supporting member 5 and the second electrode 3 were bonded together, and the supporting member 6 and the first electrode 2 were similarly bonded together, to thereby produce an electricity-generating element unit, in which the two electricity-generating elements were sandwiched between the supporting members 5 and 6. The electricity-generating element unit was arranged in an insole in a manner that the electricity-generating elements of the electricity-generating element unit were placed in the same positions as in Comparative Example 4, to thereby produce an electric generator of Example 13.

<Evaluation Method>

Cumulative energy of the electric generator of Example 13 was evaluated in the same manner as in Comparative Example 4, and power-generating performance of the electric generator of Example 13 was evaluated by a rank based on the following evaluation criteria. The result is presented in Table 2.

[Evaluation Criteria]

Rank A: power-generating performance was improved 10 times or greater the cumulative energy of Comparative Example 4.

Rank B: power-generating performance was improved 5 times or greater but less than 10 times the cumulative energy of Comparative Example 4.

Rank C: power-generating performance was improved 3 times or greater but less than 5 times the cumulative energy of Comparative Example 4.

Rank D: power-generating performance was improved greater than 1 time but less than 3 times the cumulative energy of Comparative Example 4.

Example 14

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. An electricity-generating element, in which a material of the intermediate layer was identical to that of Comparative Example 4 but the intermediate layer was not bonded to a second electrode, was housed in the housing member. A first electrode and the second electrode were bonded to an inner side of the bag with double-sided tape (Nicetack, available from NICHIBAN CO., LTD.). In the manner as described, two regions each including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 14.

When a downward force was applied to one of the regions, the second electrode was completely released from the intermediate layer in the other region because the intermediate layer and the second electrode were not bonded together.

<Evaluation Method>

Cumulative energy of the electric generator of Example 14 was evaluated in the same manner as in Example 13, and power-generating performance of the electric generator of Example 14 relative to Comparative Example 4 was evaluated by a rank. The result is presented in Table 2.

Example 15

<Production of Electricity-Generating Element Unit and Electric Generator>

An electric generator of Example 15 was produced in the same manner as in Example 14, except that the air sealed in the regions and in the coupling unit was replaced with nitrogen.

<Evaluation Method>

Cumulative energy of the electric generator of Example 15 was evaluated in the same manner as in Example 13, and power-generating performance of the electric generator of Example 15 relative to Comparative Example 4 was evaluated by a rank. The result is presented in Table 2.

Example 16

<Production of Electricity-Generating Element and Electric Generator>

An electric generator of Example 16 was produced in the same manner as in Example 14, except that the air sealed in the regions and in the coupling unit was replaced with propylene glycol (PG, available from Wako Pure Chemical Industries, Ltd.).

<Evaluation Method>

Cumulative energy of the electric generator of Example 16 was evaluated in the same manner as in Example 13, and power-generating performance of the electric generator of Example 16 relative to Comparative Example 4 was evaluated by a rank. The result is presented in Table 2.

Comparative Example 5

<Production of Electricity-Generating Element and Electric Generator>

Three electricity-generating elements, each of which was identical to that of Comparative Example 4, were produced. One of the electricity-generating elements was disposed in a heel area of an insole, and two of the electricity-generating elements were disposed in a toe area of the insole. Each of the electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), to thereby produce an electric generator of Comparative Example 5. A connection wiring of the electricity-generating elements was as illustrated in FIG. 10.

<Evaluation Method>

Cumulative energy of the electric generator of Comparative Example 5 was calculated in the same manner as in Comparative Example 1.

Example 17

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. An electricity-generating element, in which a material of the intermediate layer was identical to that of Comparative Example 4 but the intermediate layer was not bonded to a second electrode, was housed in the housing member. A first electrode and the second electrode were bonded to an inner side of the bag with double-sided tape (Nicetack, available from NICHIBAN CO., LTD.). In the manner as described, regions each including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged in the same manner as in Comparative Example 5, to thereby produce an electric generator of Example 17.

<Evaluation Method>

Cumulative energy of the electric generator of Example 17 was evaluated in the same manner as in Comparative Example 5, and power-generating performance of the electric generator of Example 17 relative to Comparative Example 5 was evaluated by a rank based on the following evaluation criteria. The result is presented in Table 2.

[Evaluation Criteria]

Rank A: power-generating performance was improved 10 times or greater the cumulative energy of Comparative Example 5.

Rank B: power-generating performance was improved 5 times or greater but less than 10 times the cumulative energy of Comparative Example 5.

Rank C: power-generating performance was improved 3 times or greater but less than 5 times the cumulative energy of Comparative Example 5.

Rank D: power-generating performance was improved greater than 1 time but less than 3 times the cumulative energy of Comparative Example 5.

TABLE 1

| | Material of intermediate layer | Electrodes First electrode | Electrodes Second electrode | Coupling unit | Regions | Fluid | Space between intermediate layer and electrode |
|---|---|---|---|---|---|---|---|
| Comp. Ex. 1 | PZT | Au | Au | none | none | NA | NA |
| Ex. 1 | PZT | Au | Au | acrylic plate | none | none | none |
| Ex. 2 | PZT | Au | Au | Si tube | NA/PE bag | air | none |
| Ex. 3 | PZT | Au | Au | Si tube | NA/PE bag | nitrogen | none |
| Ex. 4 | PZT | Au | Au | Si tube | NA/PE bag | PG | none |
| Comp. Ex. 2 | PVDF | Ni/Cu | Ni/Cu | none | none | NA | NA |
| Ex. 5 | PVDF | Ni/Cu | Ni/Cu | acrylic plate | none | none | none |
| Ex. 6 | PVDF | Ni/Cu | Ni/Cu | Si tube | NA/PE bag | air | none |
| Ex. 7 | PVDF | Ni/Cu | Ni/Cu | Si tube | NA/PE bag | nitrogen | none |
| Ex. 8 | PVDF | Ni/Cu | Ni/Cu | Si tube | NA/PE bag | PG | none |
| Comp. Ex. 3 | electret | SUS | SUS | none | none | NA | NA |
| Ex. 9 | electret | SUS | SUS | acrylic plate | none | none | none |
| Ex. 10 | electret | SUS | SUS | Si tube | NA/PE bag | air | present |
| Ex. 11 | electret | SUS | SUS | Si tube | NA/PE bag | nitrogen | present |
| Ex. 12 | electret | SUS | SUS | Si tube | NA/PE bag | PG | present |
| Comp. Ex. 4 | silicone rubber | Al | Al | none | none | NA | NA |
| Ex. 13 | silicone rubber | Al | Al | acrylic plate | none | none | none |
| Ex. 14 | silicone rubber | Al | Al | Si tube | NA/PE bag | air | present |
| Ex. 15 | silicone rubber | Al | Al | Si tube | NA/PE bag | nitrogen | present |
| Ex. 16 | silicone rubber | Al | Al | Si tube | NA/PE bag | PG | present |
| Comp. Ex. 5 | silicone rubber | Al | Al | none | none | NA | NA |
| Ex. 17 | silicone rubber | Al | Al | Si tube | NA/PE bag | air | present |

TABLE 2

| | Power generation evaluation | |
|---|---|---|
| | Output magnification | Rank |
| Comp. Ex. 1 | 1 | Standard |
| Ex. 1 | 3.9 | C |
| Ex. 2 | 8.1 | B |
| Ex. 3 | 8.0 | B |
| Ex. 4 | 3.7 | C |
| Comp. Ex. 2 | 1 | Standard |
| Ex. 5 | 3.1 | C |
| Ex. 6 | 6.5 | B |
| Ex. 7 | 3.1 | C |
| Ex. 8 | 3.3 | C |
| Comp. Ex. 3 | 1 | Standard |
| Ex. 9 | 3.4 | C |
| Ex. 10 | 9.4 | B |
| Ex. 11 | 9.3 | B |
| Ex. 12 | 2.3 | D |
| Comp. Ex. 4 | 1 | Standard |
| Ex. 13 | 4.0 | C |
| Ex. 14 | 12.9 | A |
| Ex. 15 | 11.6 | A |
| Ex. 16 | 1.7 | D |
| Comp. Ex. 5 | 1 | Standard |
| Ex. 17 | 14.9 | A |

Comparative Example 6

<Production of Electricity-Generating Element and Electric Generator>

Four electricity-generating elements each having PZT ceramic as an intermediate layer, identical to the one in Comparative Example 1, were used. The electricity-generating elements were respectively disposed on four corners of a floor base (acrylic resin plate). Each of the electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), and a floor surface constituting material was attached, to thereby produce an electric generator of Comparative Example 6. A connection wiring of the electricity-generating elements was as illustrated in FIG. 10.

<Evaluation Method>

An evaluator stood on a centric area of the floor panel of Comparative Example 6, and walked on a spot at a pace of 2 steps per second (2 Hz) in a state where the lead wire was coupled to the oscilloscope. A wave shape for the two steps (one of the steps was by the left foot and the other was by the right foot) was read, and cumulative energy was calculated from the wave shape.

Example 18

<Production of Electricity-Generating Element Unit and Electric Generator>

In order to couple four electricity-generating elements to each other as illustrated in FIG. 13, the electricity-generating elements were bonded to an acrylic resin plate in a size of 80 mm×15 mm×2 mm as illustrated in FIG. 1 with double-sided tape (Nicetack, available from NICHIBAN CO., LTD.) to provide a coupling unit. Except for the point as described above, an electricity-generating element unit was produced in the same manner as in Comparative Example 6.

An electric generator of Example 18 was produced in the same manner as in Comparative Example 6, except that the coupling unit was disposed.
<Evaluation Method>
Cumulative energy of the electric generator of Example 18 was calculated in the same manner as in Comparative Example 6, and power-generating performance of the electric generator of Example 18 relative to Comparative Example 6 was evaluated by a rank based on the following evaluation criteria. The result is presented in Table 4.
[Evaluation Criteria]
Rank A: power-generating performance was improved 10 times or greater the cumulative energy of Comparative Example 6.
Rank B: power-generating performance was improved 5 times or greater but less than 10 times the cumulative energy of Comparative Example 6.
Rank C: power-generating performance was improved 3 times or greater but less than 5 times the cumulative energy of Comparative Example 6.
Rank D: power-generating performance was improved greater than 1 time but less than 3 times the cumulative energy of Comparative Example 6.

Example 19

<Production of Electricity-Generating Element Unit and Electric Generator>
A bag with a zip (made of NA/PE, Lamizip LZ-9, available from SEISANNIPPONSHA LTD.) in a size of 115 mm×90 mm was used as a housing member. One electricity-generating element identical to that of Comparative Example 7 was housed in the housing member. The first electrode and the second electrode were bonded to an inner side of the bag with double-sided tape (Nicetack, available from NICHIBAN CO., LTD.). In the manner as described, regions each including the electricity-generating element and the housing member housing the electricity-generating element were produced.
Both of the regions were coupled with a tube (opening diameter: 3 mm) formed of silicone rubber, and were sealed in a manner that air was included in the regions, to thereby produce an electricity-generating element unit. An electric generator of Example 19 was produced in the same manner as in Example 18, except that the coupling unit was disposed.
<Evaluation Method>
Cumulative energy of the electric generator of Example 19 was evaluated in the same manner as in Example 18, and power-generating performance of the electric generator of Example 19 relative to Comparative Example 6 was evaluated by a rank. The result is presented in Table 4.

Example 20

<Production of Electricity-Generating Element Unit and Electric Generator>
An electric generator of Example 20 was produced in the same manner as in Example 19, except that the air sealed in the regions and in the coupling unit was replaced with nitrogen.
<Evaluation Method>
Cumulative energy of the electric generator of Example 20 was evaluated in the same manner as in Example 18, and power-generating performance of the electric generator of Example 20 relative to Comparative Example 6 was evaluated by a rank. The result is presented in Table 4.

Example 21

<Production of Electricity-Generating Element Unit and Electric Generator>
An electric generator of Example 21 was produced in the same manner as in Example 19, except that a hole was made in the region of the electricity-generating element unit, propylene glycol (PG, available from Wako Pure Chemical Industries, Ltd.), which was an insulating liquid, was injected by a syringe with preventing inclusion of air in a manner that an amount of the insulating liquid was to be about 80% of a fluid retaining capacity of the electricity-generating element unit, and the hole was sealed with a silicone sealing agent.
<Evaluation Method>
Cumulative energy of the electric generator of Example 21 was evaluated in the same manner as in Example 18, and power-generating performance of the electric generator of Example 21 relative to Comparative Example 6 was evaluated by a rank. The result is presented in Table 4.

Comparative Example 7

<Production of Electricity-Generating Element Unit and Electric Generator>
Four electricity-generating elements each having polyvinylidene fluoride (PVDF) as an intermediate layer, identical to the one in Comparative Example 2, were used. The electricity-generating elements were respectively disposed on four corners of a floor base (acrylic resin plate). Each of the electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), and a floor surface constituting material was attached, to thereby produce an electric generator of Comparative Example 7. A connection wiring of the electricity-generating elements was as illustrated in FIG. 10.
<Evaluation Method>
Cumulative energy of the electric generator of Comparative Example 7 was calculated in the same manner as in Comparative Example 6.

Example 22

<Production of Electricity-Generating Element Unit and Electric Generator>
In order to couple four electricity-generating elements to each other as illustrated in FIG. 13, the electricity-generating elements were bonded to an acrylic resin plate in a size of 80 mm×15 mm×2 mm as illustrated in FIG. 1 with double-sided tape (Nicetack, available from NICHIBAN CO., LTD.) to provide a coupling unit. Except for the point as described above, an electricity-generating element unit was produced in the same manner as in Comparative Example 7. An electric generator of Example 22 was produced in the same manner as in Comparative Example 7, except that the coupling unit was disposed.
<Evaluation Method>
Cumulative energy of the electric generator of Example 22 was evaluated in the same manner as in Comparative Example 7, and power-generating performance of the electric generator of Example 22 was evaluated by a rank based on the following evaluation criteria. The result is presented in Table 4.

[Evaluation Criteria]

Rank A: power-generating performance was improved 10 times or greater the cumulative energy of Comparative Example 7.

Rank B: power-generating performance was improved 5 times or greater but less than 10 times the cumulative energy of Comparative Example 7.

Rank C: power-generating performance was improved 3 times or greater but less than 5 times the cumulative energy of Comparative Example 7.

Rank D: power-generating performance was improved greater than 1 time but less than 3 times the cumulative energy of Comparative Example 7.

Example 23

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. One electricity-generating element identical to that of Comparative Example 7 was housed in the housing member. The first electrode and the second electrode were bonded to an inner side of the bag with double-sided tape (Nicetack, available from NICHIBAN CO., LTD.). In the manner as described, regions each including the electricity-generating element and the housing member housing the electricity-generating element were produced.

Both of the regions were coupled with a tube (opening diameter: 3 mm) formed of silicone rubber, and were sealed in a manner that air was included in the regions in an amount of about 80% of a fluid retaining capacity of an electricity-generating element unit, to thereby produce the electricity-generating element unit. An electric generator of Example 23 was produced in the same manner as in Comparative Example 7, except that the coupling unit was disposed.

<Evaluation Method>

Cumulative energy of the electric generator of Example 23 was evaluated in the same manner as in Example 22, and power-generating performance of the electric generator of Example 23 relative to Comparative Example 7 was evaluated by a rank. The result is presented in Table 4.

Example 24

<Production of Electricity-Generating Element Unit and Electric Generator>

An electric generator of Example 24 was produced in the same manner as in Example 23, except that the air sealed in the regions and in the coupling unit was replaced with nitrogen.

<Evaluation Method>

Cumulative energy of the electric generator of Example 24 was evaluated in the same manner as in Example 22, and power-generating performance of the electric generator of Example 24 relative to Comparative Example 7 was evaluated by a rank. The result is presented in Table 4.

Example 25

<Production of Electricity-Generating Element Unit and Electric Generator>

An electric generator of Example 25 was produced in the same manner as in Example 23, except that the air sealed in the regions and in the coupling unit was replaced with propylene glycol (PG, available from Wako Pure Chemical Industries, Ltd.).

<Evaluation Method>

Cumulative energy of the electric generator of Example 25 was evaluated in the same manner as in Example 22, and power-generating performance of the electric generator of Example 25 relative to Comparative Example 7 was evaluated by a rank. The result is presented in Table 4.

Comparative Example 8

Four electricity-generating elements each having the electret material as an intermediate layer, identical to the one in Comparative Example 3, were used. The electricity-generating elements were respectively disposed on four corners of a floor base (acrylic resin plate). Each of the electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), and a floor surface constituting material was attached, to thereby produce an electric generator of Comparative Example 8. A connection wiring of the electricity-generating elements was as illustrated in FIG. 10.

<Evaluation Method>

Cumulative energy of the electric generator of Comparative Example 8 was calculated in the same manner as in Comparative Example 6.

Example 26

<Production of Electricity-Generating Element Unit and Electric Generator>

In order to couple four electricity-generating elements to each other as illustrated in FIG. 13, the electricity-generating elements were bonded to an acrylic resin plate in a size of 80 mm×15 mm×2 mm as illustrated in FIG. 1 with double-sided tape (Nicetack, available from NICHIBAN CO., LTD.) to provide a coupling unit. Except for the point as described above, an electricity-generating element unit was produced in the same manner as in Comparative Example 8. An electric generator of Example 26 was produced in the same manner as in Comparative Example 8, except that the coupling unit was disposed.

<Evaluation Method>

Cumulative energy of the electric generator of Example 26 was evaluated in the same manner as in Comparative Example 8, and power-generating performance of the electric generator of Example 26 was evaluated by a rank based on the following evaluation criteria. The result is presented in Table 4.

[Evaluation Criteria]

Rank A: power-generating performance was improved 10 times or greater the cumulative energy of Comparative Example 8.

Rank B: power-generating performance was improved 5 times or greater but less than 10 times the cumulative energy of Comparative Example 8.

Rank C: power-generating performance was improved 3 times or greater but less than 5 times the cumulative energy of Comparative Example 8.
Rank D: power-generating performance was improved greater than 1 time but less than 3 times the cumulative energy of Comparative Example 8.

Example 27

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. An electricity-generating element, in which a material of the intermediate layer was identical to that of Comparative Example 8 but the intermediate layer was not bonded to a second electrode, was housed in the housing member. A first electrode and the second electrode were bonded to an inner side of the bag with double-sided tape (Nicetack, available from NICHIBAN CO., LTD.). In the manner as described, regions including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 27.

<Evaluation Method>

Cumulative energy of the electric generator of Example 27 was evaluated in the same manner as in Example 26, and power-generating performance of the electric generator of Example 27 relative to Comparative Example 8 was evaluated by a rank. The result is presented in Table 4.

Example 28

<Production of Electricity-Generating Element Unit and Electric Generator>

An electric generator of Example 28 was produced in the same manner as in Example 27, except that the air sealed in the regions and in the coupling unit was replaced with nitrogen.

<Evaluation Method>

Cumulative energy of the electric generator of Example 28 was evaluated in the same manner as in Example 26, and power-generating performance of the electric generator of Example 28 relative to Comparative Example 8 was evaluated by a rank. The result is presented in Table 4.

Example 29

<Production of Electricity-Generating Element Unit and Electric Generator>

An electric generator of Example 29 was produced in the same manner as in Example 27, except that the air sealed in the regions and in the coupling unit was replaced with propylene glycol (PG, available from Wako Pure Chemical Industries, Ltd.).

<Evaluation Method>

Cumulative energy of the electric generator of Example 29 was evaluated in the same manner as in Example 26, and power-generating performance of the electric generator of Example 29 relative to Comparative Example 8 was evaluated by a rank. The result is presented in Table 4.

Comparative Example 9

<Production of Electricity-Generating Element and Electric Generator>

Four electricity-generating elements each having silicone rubber as an intermediate layer, identical to the one in Comparative Example 4, were used. The electricity-generating elements were respectively disposed on four corners of a floor base (acrylic resin plate). Each of the electricity-generating elements was coupled to a lead wire (C3/RV-90 0.75SQ, available from Taiyo Cabletec Corporation) and to an oscilloscope (WaveAce1001 available from Teledyne LeCroy Japan Corporation, resistance: 1 MΩ), and a floor surface constituting material was attached, to thereby produce an electric generator of Comparative Example 9. A connection wiring of the electricity-generating elements was as illustrated in FIG. 10.

<Evaluation Method>

Cumulative energy of the electric generator of Comparative Example 9 was calculated in the same manner as in Comparative Example 8.

Example 30

<Production of Electricity-Generating Element Unit and Electric Generator>

In order to couple four electricity-generating elements to each other as illustrated in FIG. 13, the electricity-generating elements were bonded to an acrylic resin plate in a size of 80 mm×15 mm×2 mm as illustrated in FIG. 1 with double-sided tape (Nicetack, available from NICHIBAN CO., LTD.) to provide a coupling unit. Except for the point as described above, an electricity-generating element unit was produced in the same manner as in Comparative Example 9. An electric generator of Example 30 was produced in the same manner as in Comparative Example 9, except that the coupling unit was disposed.

<Evaluation Method>

Cumulative energy of the electric generator of Example 30 was evaluated in the same manner as in Comparative Example 9, and power-generating performance of the electric generator of Example 30 was evaluated by a rank based on the following evaluation criteria. The result is presented in Table 4.

[Evaluation Criteria]
Rank A: power-generating performance was improved 10 times or greater the cumulative energy of Comparative Example 9.
Rank B: power-generating performance was improved 5 times or greater but less than 10 times the cumulative energy of Comparative Example 9.
Rank C: power-generating performance was improved 3 times or greater but less than 5 times the cumulative energy of Comparative Example 9.
Rank D: power-generating performance was improved greater than 1 time but less than 3 times the cumulative energy of Comparative Example 9.

Example 31

<Production of Electricity-Generating Element Unit and Electric Generator>

A bag with a zip (made of NA/PE, Lamizip LZ-9, available from SEISANNIPPONSHA LTD.) in a size of 115 mm×90 mm was used as a housing member. An electricity-generating element, in which a material of the intermediate layer was identical to that of Comparative Example 9 but the intermediate layer was not bonded to a second electrode, was housed in the housing member. A first electrode and the second electrode were bonded to an inner side of the bag with double-sided tape (Nicetack, available from NICHIBAN CO., LTD.). In the manner as described, regions each including the electricity-generating element and the housing member housing the electricity-generating element were produced.

Both of the regions were coupled with a tube (opening diameter: 3 mm) formed of silicone rubber, and were sealed in a manner that air was included in the regions, to thereby produce an electricity-generating element unit. An amount of the air was adjusted to be about 80% of a fluid retaining capacity of the entire electricity-generating element unit. The electricity-generating element unit was arranged as illustrated in FIG. 7, and lead wires and rectifier circuits were attached as illustrated in FIG. 10, to thereby produce an electric generator of Example 31.

<Evaluation Method>

Cumulative energy of the electric generator of Example 31 was evaluated in the same manner as in Example 30, and power-generating performance of the electric generator of Example 31 relative to Comparative Example 9 was evaluated by a rank. The result is presented in Table 4.

Example 32

<Production of Electricity-Generating Element Unit and Electric Generator>

An electric generator of Example 32 was produced in the same manner as in Example 31, except that the air sealed in the regions and in the coupling unit was replaced with nitrogen.

<Evaluation Method>

Cumulative energy of the electric generator of Example 32 was evaluated in the same manner as in Example 30, and power-generating performance of the electric generator of Example 32 relative to Comparative Example 9 was evaluated by a rank. The result is presented in Table 4.

Example 33

<Production of Electricity-Generating Element Unit and Electric Generator>

An electric generator of Example 33 was produced in the same manner as in Example 31, except that the air sealed in the regions and in the coupling unit was replaced with propylene glycol (PG, available from Wako Pure Chemical Industries, Ltd.).

<Evaluation Method>

Cumulative energy of the electric generator of Example 33 was evaluated in the same manner as in Example 30, and power-generating performance of the electric generator of Example 33 relative to Comparative Example 9 was evaluated by a rank. The result is presented in Table 4.

TABLE 3

| | Material of intermediate layer | Electrodes | | Coupling unit | Regions | Fluid | Space between intermediate layer and electrode | The number of elements |
|---|---|---|---|---|---|---|---|---|
| | | First electrode | Second electrode | | | | | |
| Comp. Ex. 6 | PZT | Au | Au | none | none | NA | NA | 4 |
| Ex. 18 | PZT | Au | Au | acrylic plate | none | none | none | 4 |
| Ex. 19 | PZT | Au | Au | Si tube | NA/PE bag | air | none | 4 |
| Ex. 20 | PZT | Au | Au | Si tube | NA/PE bag | nitrogen | none | 4 |
| Ex. 21 | PZT | Au | Au | Si tube | NA/PE bag | PG | none | 4 |
| Comp. Ex. 7 | PVDF | Ni/Cu | Ni/Cu | none | none | NA | NA | 4 |
| Ex. 22 | PVDF | Ni/Cu | Ni/Cu | acrylic plate | none | none | none | 4 |
| Ex. 23 | PVDF | Ni/Cu | Ni/Cu | Si tube | NA/PE bag | air | none | 4 |
| Ex. 24 | PVDF | Ni/Cu | Ni/Cu | Si tube | NA/PE bag | nitrogen | none | 4 |
| Ex. 25 | PVDF | Ni/Cu | Ni/Cu | Si tube | NA/PE bag | PG | none | 4 |
| Comp. Ex. 8 | electret | SUS | SUS | none | none | NA | NA | 4 |
| Ex. 26 | electret | SUS | SUS | acrylic plate | none | none | none | 4 |
| Ex. 27 | electret | SUS | SUS | Si tube | NA/PE bag | air | present | 4 |
| Ex. 28 | electret | SUS | SUS | Si tube | NA/PE bag | nitrogen | present | 4 |
| Ex. 29 | electret | SUS | SUS | Si tube | NA/PE bag | PG | present | 4 |
| Comp. Ex. 9 | silicone rubber | Al | Al | none | none | NA | NA | 4 |
| Ex. 30 | silicone rubber | Al | Al | acrylic plate | none | none | none | 4 |
| Ex. 31 | silicone rubber | Al | Al | Si tube | NA/PE bag | air | present | 4 |
| Ex. 32 | silicone rubber | Al | Al | Si tube | NA/PE bag | nitrogen | present | 4 |
| Ex. 33 | silicone rubber | Al | Al | Si tube | NA/PE bag | PG | present | 4 |

TABLE 4

| | Power generation evaluation | |
|---|---|---|
| | Output magnification | Rank |
| Comp. Ex. 6 | 1 | Standard |
| Ex. 18 | 3.1 | C |
| Ex. 19 | 8.5 | B |
| Ex. 20 | 8.3 | B |
| Ex. 21 | 3.6 | C |
| Comp. Ex. 7 | 1 | Standard |
| Ex. 22 | 2.4 | D |
| Ex. 23 | 7.0 | B |
| Ex. 24 | 6.7 | B |
| Ex. 25 | 3.2 | C |
| Comp. Ex. 8 | 1 | Standard |
| Ex. 26 | 3.0 | C |
| Ex. 27 | 9.4 | B |
| Ex. 28 | 8.1 | B |
| Ex. 29 | 2.5 | D |
| Comp. Ex. 9 | 1 | Standard |
| Ex. 30 | 4.4 | C |
| Ex. 31 | 15.3 | A |
| Ex. 32 | 14.2 | A |
| Ex. 33 | 1.8 | D |

Aspects of the present invention are, for example, as follows.

<1> An electricity-generating element unit including:
a plurality of electricity-generating elements, each of the plurality of electricity-generating elements including a first electrode, an intermediate layer, and a second electrode disposed with the intermediate layer being between the first electrode and the second electrode; and a coupling unit coupling the plurality of electricity-generating elements to each other,
wherein when an external force is applied to at least one of the plurality of electricity-generating elements to bring the first electrode and the second electrode of the at least one of the plurality of electricity-generating elements close to each other, a distance between the first electrode and the second electrode of the electricity-generating element or each of the electricity-generating elements to which an external force is not applied is increased by the coupling unit.
<2> The electricity-generating element unit according to <1>, wherein the coupling unit is a unit configured to transmit a force that is in a parallel and opposite direction relative to a direction of the external force applied to the one of the plurality of electricity-generating elements, to another electricity-generating element or other electricity-generating elements in the plurality of electricity-generating elements using a center of gravity of the coupling unit as a fulcrum.
<3> The electricity-generating element unit according to <1>, wherein the electricity-generating element unit comprises a plurality of regions, each of the plurality of regions including the electricity-generating element and a housing member housing the electricity-generating element, and the plurality of regions are coupled to each other by the coupling unit in a manner that a fluid can move through the plurality of regions, and wherein when an external force is applied to at least one of the plurality of regions to bring the first electrode and the second electrode of the electricity-generating element of the at least one of the plurality of regions close to each other, the fluid is moved by the coupling unit to the region or each of the regions to which an external force is not applied, to increase a distance between the first electrode and the second electrode of the electricity-generating element of the region or each of the regions.
<4> The electricity-generating element unit according to <3>, wherein the housing member is a member in which the fluid can be sealed.
<5> The electricity-generating element unit according to <3> or <4>, wherein the housing member is a member, a volume of which can be changed.
<6> The electricity-generating element unit according to <5>, wherein the housing member is a bag made of resin.
<7> The electricity-generating element unit according to any one of <3> to <6>, wherein the coupling unit contains a hollow part through which the fluid can move.
<8> The electricity-generating element unit according to any one of <3> to <7>, wherein the coupling unit has flexibility.
<9> The electricity-generating element unit according to <8>, wherein the coupling unit includes a silicone rubber tube.
<10> The electricity-generating element unit according to any one of <3> to <9>, wherein the fluid includes a gas or a liquid.
<11> The electricity-generating element unit according to <10>, wherein the fluid includes a gas.
<12> The electricity-generating element unit according to <11>, wherein the gas includes nitrogen or air.
<13> The electricity-generating element unit according to any one of <1> to <12>, wherein when the distance between the first electrode and the second electrode of one of the plurality of electricity-generating elements is increased, a space is formed between the intermediate layer and the first electrode or between the intermediate layer and the second electrode.
<14> The electricity-generating element unit according to any one of <1> to <13>, wherein the intermediate layer of the electricity-generating element is at least one selected from the group consisting of ceramics, electret dielectric, and rubber.
<15> The electricity-generating element unit according to <14>, wherein the rubber includes a silicone rubber composition.
<16> The electricity-generating element unit according to any one of <13> to <15>, wherein the intermediate layer of any of the electricity-generating elements has been subjected to a surface modification treatment.
<17> The electricity-generating element unit according to <16>, wherein the surface modification treatment includes a plasma treatment or a corona discharge treatment.
<18> An electric generator including the electricity-generating element unit according to any one of <1> to <17>.
<19> Footwear including
the electric generator according to <18>.
<20> A flooring material including the electric generator according to <18>.
<21> A wearing product including the electric generator according to <18>.

The electricity-generating element unit according to any one of <1> to <17>, the electric generator according to <18>, the footwear according to <19>, the flooring material according to <20>, and the wearing product according to <21> solve the aforementioned problems in the art, and achieve the following object. Specifically, the object is to provide an electricity-generating element unit, an electric generator, footwear, a flooring material, and a wearing product, all of which can generate high electric power.

What is claimed is:
1. An electricity-generating device comprising:
a plurality of electricity-generating elements, each of the plurality of electricity-generating elements comprising a first electrode, an intermediate layer, and a second electrode disposed with the intermediate layer being between the first electrode and the second electrode; and a coupling structure coupling the plurality of electricity-generating elements to each other, wherein when an external force is applied to a first one of the plurality of electricity-generating elements to bring the first electrode and the second electrode of the first one of the plurality of electricity-generating elements close to each other, the coupling structure is configured to transmit a force, in response to the external force, to a second one of the plurality of electricity-generating elements to move the first electrode and the second electrode of the second one of the plurality of electricity-generating elements away from each other.

2. The electricity-generating device according to claim 1, wherein the coupling structure is configured to transmit the force that is in a parallel and opposite direction relative to a direction of the external force applied to the first one of the plurality of electricity-generating elements to the second one of the plurality of electricity-generating elements using a center of gravity of the coupling structure as a fulcrum.

3. The electricity-generating device according to claim 1, wherein the electricity-generating device comprises a plurality of regions, each of the plurality of regions comprising a respective electricity-generating element and a housing member housing the respective electricity-generating element, and the plurality of regions are coupled to each other by the coupling structure in a manner that a fluid can move among the plurality of regions, and wherein when the external force is applied to a first one of the plurality of regions to bring the first electrode and the second electrode of the respective electricity-generating element in the first one of the plurality of regions close to each other, the fluid is moved through the coupling device to a second one of the plurality of regions to which the external force is not applied, to increase a distance between the first electrode and the second electrode of the respective electricity-generating element in the second one of the plurality of regions.

4. The electricity-generating device according to claim 3, wherein the housing member is a member in which the fluid is sealed.

5. The electricity-generating device according to claim 4, wherein the housing member is a bag made of resin.

6. The electricity-generating device according to claim 3, wherein the coupling structure contains a hollow part through which the fluid is movable.

7. The electricity-generating device according to claim 3, wherein the coupling structure has flexibility.

8. The electricity-generating device according to claim 7, wherein the coupling structure comprises a silicone rubber tube.

9. The electricity-generating device according to claim 3, wherein the fluid comprises a gas or a liquid.

10. The electricity-generating device according to claim 9, wherein the fluid comprises a gas.

11. The electricity-generating device according to claim 10, wherein the gas comprises nitrogen or air.

12. The electricity-generating device according to claim 1, wherein when a distance between the first electrode and the second electrode of the second one of the plurality of electricity-generating elements is increased, a space is formed between the intermediate layer and the first electrode or between the intermediate layer and the second electrode of the second one of the plurality of electricity-generating elements.

13. The electricity-generating device according to claim 1, wherein the intermediate layer of the first one of the plurality of electricity-generating elements is at least one selected from the group consisting of ceramics, electret dielectric, and rubber.

14. The electricity-generating device according to claim 13, wherein the rubber comprises a silicone rubber composition.

15. An electric generator comprising
an electricity-generating device, the electricity-generating device comprising:
a plurality of electricity-generating elements, each of the plurality of electricity-generating elements comprising a first electrode, an intermediate layer, and a second electrode disposed with the intermediate layer being between the first electrode and the second electrode; and
a coupling structure coupling the plurality of electricity-generating elements to each other,
wherein when an external force is applied to a first one of the plurality of electricity-generating elements to move the first electrode and the second electrode of the first one of the plurality of electricity-generating elements close to each other, the coupling structure is configured to transmit a force, in response to the external force, to a second one of the plurality of electricity-generating elements to move the first electrode and the second electrode of the second one of the plurality of electricity-generating elements away from each other.

16. Footwear comprising
the electric generator according to claim 15.

17. A flooring material comprising
the electric generator according to claim 15.

* * * * *